(12) United States Patent
Taketomi et al.

(10) Patent No.: US 9,996,991 B2
(45) Date of Patent: Jun. 12, 2018

(54) ENGINE GENERATOR

(71) Applicant: YAMAHA MOTOR POWER PRODUCTS KABUSHIKI KAISHA, Kakegawa-shi, Shizuoka (JP)

(72) Inventors: Koichi Taketomi, Shizuoka (JP); Keisuke Sugiura, Shizuoka (JP); Shinichi Suzuki, Shizuoka (JP)

(73) Assignee: YAMAHA MOTOR POWER PRODUCTS KABUSHIKI KAISHA, Shizuoka (JP)

( * ) Notice: Subject to any disclaimer, the term of this patent is extended or adjusted under 35 U.S.C. 154(b) by 0 days. days.

(21) Appl. No.: 15/490,961

(22) Filed: Apr. 19, 2017

(65) Prior Publication Data
US 2017/0309090 A1 Oct. 26, 2017

(30) Foreign Application Priority Data

Apr. 20, 2016 (JP) .................................. 2016-084861

(51) Int. Cl.
*G01R 31/34* (2006.01)
*G07C 5/08* (2006.01)
(Continued)

(52) U.S. Cl.
CPC .......... *G07C 5/0808* (2013.01); *F02B 63/048* (2013.01); *F02D 17/04* (2013.01); *F02D 29/06* (2013.01); *F02D 41/22* (2013.01); *G01R 19/165* (2013.01); *G01R 31/34* (2013.01); *H02P 9/04* (2013.01); *H02P 29/024* (2013.01)

(58) Field of Classification Search
CPC .. G01R 31/34; G01R 31/362; G01R 31/3606; G01R 31/3658; H02J 3/38; H02P 9/04; H02P 9/48; H02P 9/302; H02P 9/305; B60L 11/04; B60L 11/14; B60L 11/102; B60L 11/123

See application file for complete search history.

(56) References Cited

U.S. PATENT DOCUMENTS 8,609,289 B2 * 12/2013 Hasegawa ............. B60L 3/0023
324/433
2002/0024323 A1 2/2002 Fukushima et al.
2002/0158470 A1 * 10/2002 Suzuki ................ H02M 5/4585
290/1 A

FOREIGN PATENT DOCUMENTS

JP 2002-058290 A 2/2002
JP 2002-078208 A 3/2002
JP 2011-010377 A 1/2011

* cited by examiner

*Primary Examiner* — Minh N Tang
(74) *Attorney, Agent, or Firm* — Keating and Bennett, LLP

(57) ABSTRACT

An engine generator includes a generator body connected to an engine, a converter including rectifiers that convert an output from the generator body to DC current, an inverter that converts an output from the converter to AC current, an input voltage detector that detects an input voltage from the generator body to the converter, and an AC current detector that detects an AC current output from the inverter. An abnormality in the engine generator is determined if a state that a current detected by the AC current detector is not higher than a first threshold value and a duty ratio of a voltage detected by the input voltage detector is not higher than the second threshold value continues for a first predetermined time; or if the current detected by the AC current detector is not higher than a third threshold value and the duty ratio change rate is not higher than a fourth threshold value.

8 Claims, 16 Drawing Sheets

(51) Int. Cl.
*F02B 63/04* (2006.01)
*F02D 41/22* (2006.01)
*G01R 19/165* (2006.01)
*H02P 9/04* (2006.01)
*F02D 17/04* (2006.01)
*F02D 29/06* (2006.01)
*H02P 29/024* (2016.01)

FIG. 2
Waveform in no-load,
normal operation
(a) R-S line voltage
(b) Detection signal
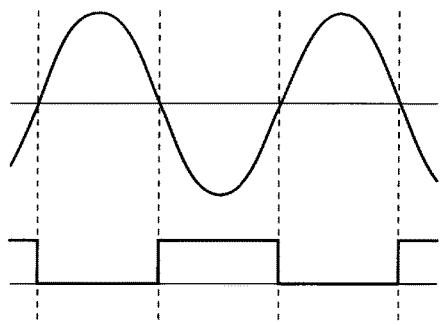
Waveform in loaded,
normal operation
(c) R-S line voltage
(d) Detection signal
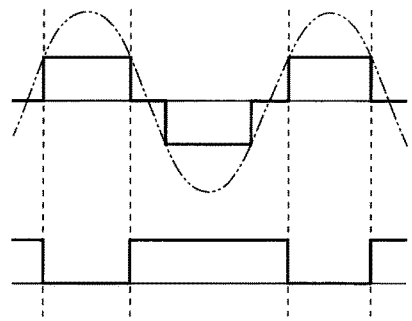
Waveform in no-load,
S-phase diode shorted operation
(e) R-S line voltage
(f) Detection signal
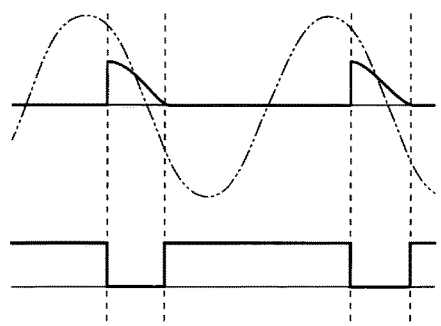
Waveform in loaded,
S-phase diode shorted operation
(g) R-S line voltage
(h) Detection signal
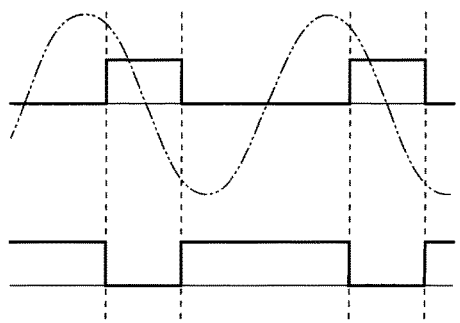

Engine control

Converter control

Abnormality lamp control

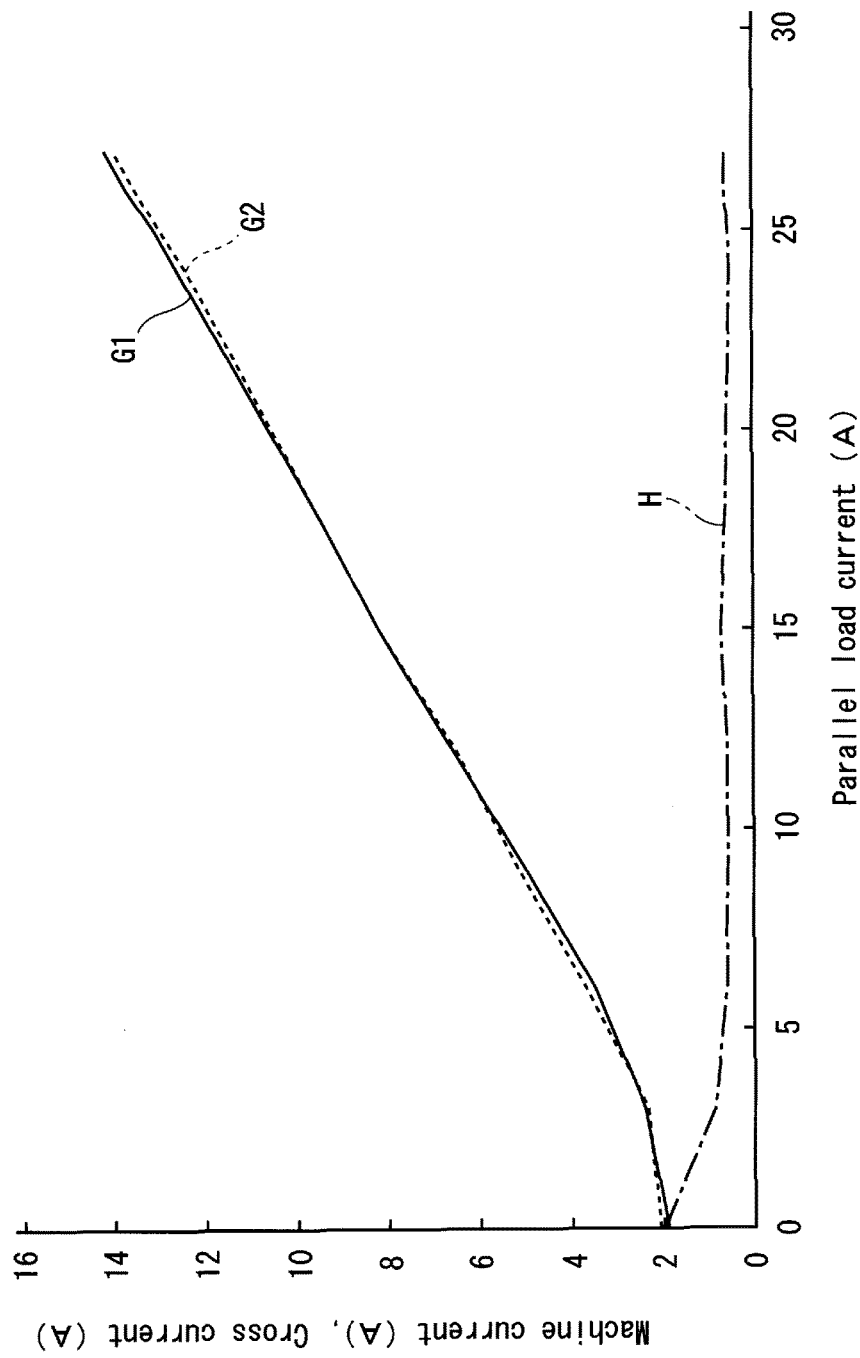

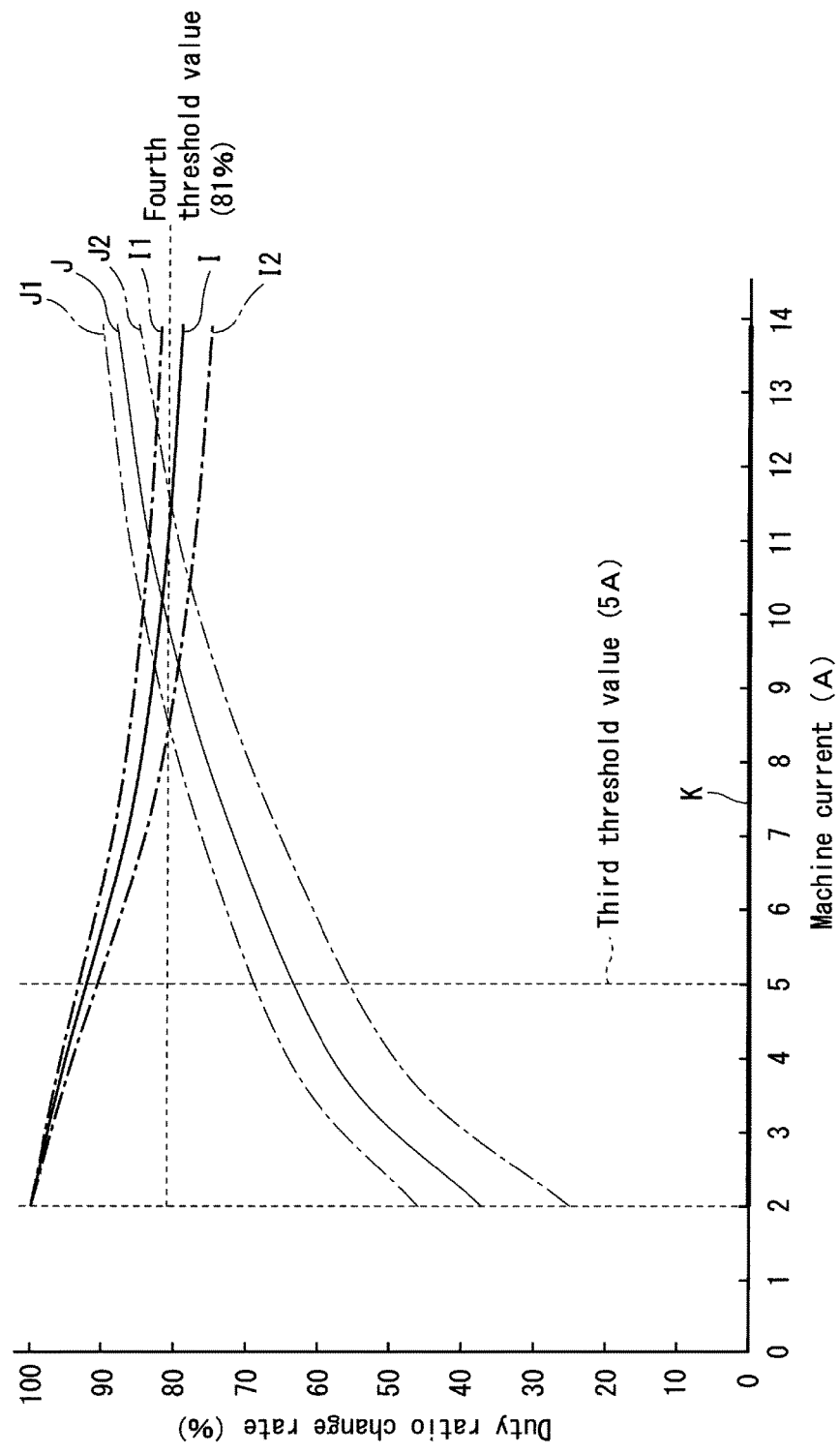

FIG. 15
Abnormality detection range (Parallel)
Diode shorted (Economical mode)
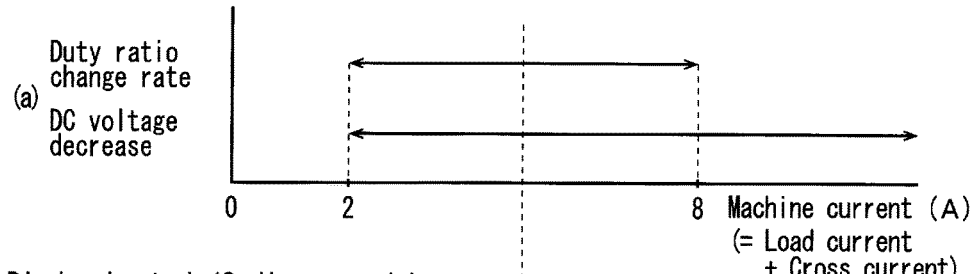
Diode shorted (Ordinary mode)
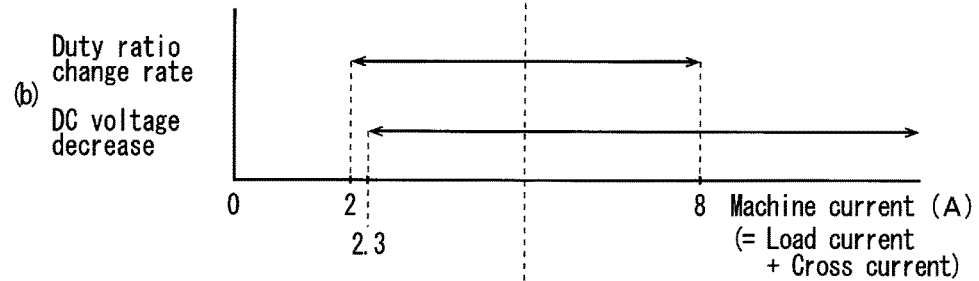
Thyristor shorted (Economical mode)
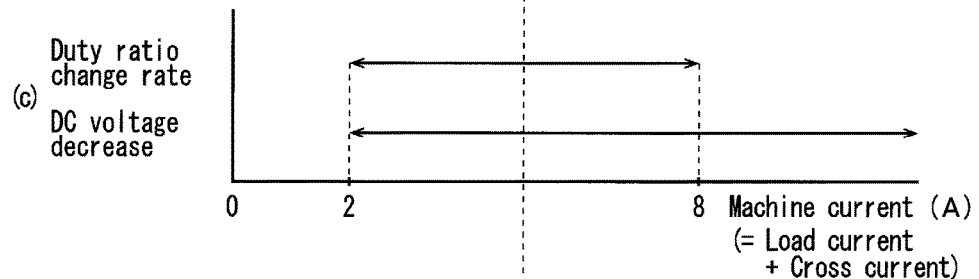
Thyristor shorted (Ordinary mode)
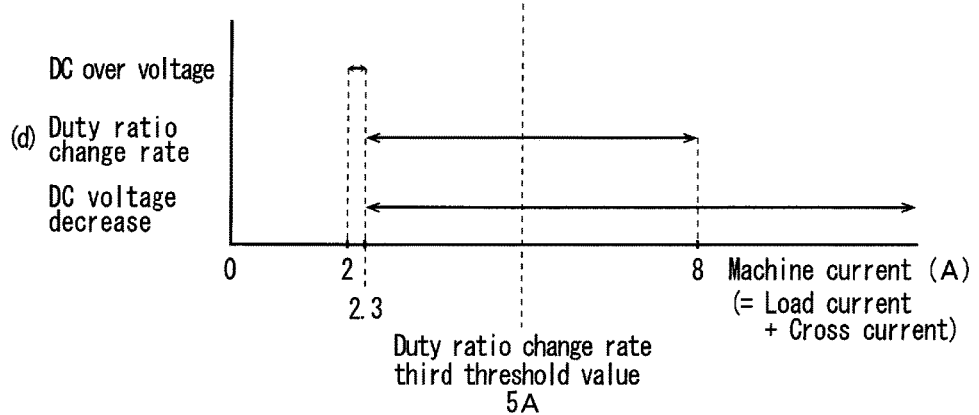

ENGINE GENERATOR

CROSS REFERENCE TO RELATED APPLICATIONS

This application claims the benefit of priority to Japanese Patent Application No. 2016-084861 filed on Apr. 20, 2016. The entire contents of this application are hereby incorporated herein by reference.

BACKGROUND OF THE INVENTION

1. Field of the Invention

The present invention relates to engine generators, and more specifically to portable engine generators.

2. Description of the Related Art

An example of a conventional technique in this field is disclosed in JP-A 2002-78208.

JP-A 2002-78208 discloses an engine electric-power generation apparatus in which an engine drives a generator including multi-phase output windings. Electric output generated by the generator is rectified, then converted by an inverter into AC power of a system frequency, and then the power is interconnected to a system power source. In this engine electric-power generation apparatus, after the engine is started, the first abnormality monitoring section monitors the DC voltage. After the DC voltage rises to a planned value, an interconnection relay is closed and the inverter output is increased to start the interconnection with the system power source. After starting the interconnection, the second abnormality monitoring section monitors the DC voltage and the inverter output, and if the DC voltage decreases to a value not higher than the planned value before the inverter output reaches a rated value, the generation apparatus repeats a disconnection/reconnection procedure of the interconnection. During this procedure, if the reconnection of the interconnection still results in a DC voltage decrease to a value not higher than the planned value, the generation apparatus determines that there is a failure, such as a disconnected wire in one of the windings, within the generator.

The apparatus described in JP-A 2002-78208 is capable of detecting a failure of the generator after the engine electric-power generation apparatus is interconnected to the system power source. However, the generation apparatus cannot detect an abnormality when the AC current outputted from the inverter is small.

SUMMARY OF THE INVENTION

Preferred embodiments of the present invention provide an engine generator that is capable of detecting an abnormality of the engine generator even when the AC current outputted from the inverter is small.

According to a preferred embodiment of the present invention, an engine generator is driven by an engine and includes a generator body connected to the engine; a converter including a plurality of rectifiers that convert an output from the generator body to DC current; an inverter that converts an output from the converter to AC current; an input voltage detector that detects an input voltage from the generator body to the converter; an AC current detector that detects an AC current outputted from the inverter; and an abnormality detector that determines a presence or absence of an abnormality in the engine generator based on information regarding a duty ratio of the voltage detected by the input voltage detector if the current detected by the AC current detector is not greater than a threshold value.

According to a preferred embodiment of the present invention, an input voltage from the generator body to the converter changes before and after a short (between normal operation and a short incident) of a rectifier which defines the converter, and therefore, a duty ratio of the input voltage from the generator body to the converter, i.e., a duty ratio of a voltage detected by the input voltage detector, also changes before and after the short of the rectifier. A difference between the two duty ratios before and after a short is large in a range where the AC current (detected by the AC current detector) outputted from the inverter is small. Therefore, it is possible to appropriately detect an abnormality in the engine generator even if the AC current outputted from the inverter is small when the current detected by the AC current detector is not greater than a threshold value, by determining whether or not there is an abnormality in the engine generator based on information regarding the duty ratio of the voltage detected by the input voltage detector.

Preferably, the threshold value includes a first threshold value, and the abnormality detector determines that there is an abnormality in the engine generator if the current detected by the AC current detector is not higher than the first threshold value and if the duty ratio is in an abnormal range based on a comparison with a second threshold value. The difference between the two duty ratios before and after a short in a rectifier of the converter is large in a range where the current detected by the AC current detector is small. Due to the above-described characteristic, it is possible to set the second threshold value, which enables discrimination between a before short duty ratio and an after short duty ratio, even if there is variability in each duty ratio before and after a short; and the first threshold value as an upper limit value of the detected current in which the second threshold value enables discrimination between the two duty ratios. By using the first threshold value and the second threshold value as described above, it is possible to determine that there is an abnormality in the engine generator if a current detected by the AC current detector is not higher than the first threshold value and if the duty ratio, as compared to the second threshold value, falls in an abnormal range (typically indicating a short in a rectifier).

Further preferably, the abnormality detector determines that there is an abnormality in the engine generator if the state that the current detected by the AC current detector is not higher than the first threshold value and the duty ratio is in the abnormal range based on a comparison with the second threshold value continues for a first predetermined time. Based on the determinations described above, it is possible to detect an abnormality in the engine generator at a high accuracy.

Further, preferably, the threshold value includes a third threshold value, and the abnormality detector determines that there is an abnormality in the engine generator if the current detected by the AC current detector is not higher than the third threshold value and if a duty ratio change rate, which is a change rate of the duty ratio, is in an abnormal range based on a comparison with a fourth threshold value. The difference between the two duty ratio change rates (change rate of the duty ratio of the voltage detected by the input voltage detector) before and after a short in a rectifier of the converter is large in a range where the current detected by the AC current detector is small. Due to this characteristic, it is possible to set the fourth threshold value, which enables discrimination between a before short duty ratio change rate and an after short duty ratio change rate, even if there is variability in each duty ratio change rate before and after a short; and the third threshold value as an upper limit value of the detected current in which the fourth threshold value enables discrimination of the two duty ratio change rates. By using the third threshold value and the fourth threshold value as described above, it is possible to determine that there is an abnormality in the engine generator if a current detected by the AC current detector is not higher than the third threshold value and if the duty ratio change rate as compared to the fourth threshold value falls in an abnormal range (typically indicating a short in a rectifier).

Preferably, the engine generator further includes a DC voltage detector that detects a DC voltage outputted from the converter. With this arrangement, the abnormality detector determines that there is an abnormality in the engine generator if the voltage detected by the DC voltage detector is not higher than a fifth threshold value. If the DC voltage output from the converter (the voltage detected by the DC voltage detector) is low, there is a possibility that a rectifier in the converter is shorted. Therefore, it is possible to detect an abnormality in the engine generator more accurately by determining that there is an abnormality in the engine generator when the voltage detected by the DC voltage detector is not higher than the fifth threshold value.

Further, preferably, the engine generator further includes a revolutions detector that detects a number of revolutions of the engine. With this arrangement, the abnormality detector determines that there is an abnormality in the engine generator if the voltage detected by the DC voltage detector is not higher than the fifth threshold value and if the number of revolutions detected by the revolutions detector is not lower than a sixth threshold value. When the engine generator is operating normally, there is an interrelationship between the number of revolutions of the engine and the voltage detected by the DC voltage detector. Namely, as the number of revolutions of the engine increases, so does the voltage detected by the DC voltage detector. Therefore, if the detected voltage is low when the number of revolutions of the engine is large, it is likely that there is an abnormality in the engine generator. Hence, determining that there is an abnormality in the engine generator when the voltage detected by the DC voltage detector is not higher than the fifth threshold value and the engine's number of revolutions detected by the revolutions detector is not smaller than the sixth threshold value makes it possible to detect an abnormality in the engine generator accurately in view of the relationship between the number of revolutions of the engine and the voltage detected by the DC voltage detector.

Further, preferably, the abnormality detector determines that there is an abnormality in the engine generator if the state that the voltage detected by the DC voltage detector is not higher than the fifth threshold value and the number of revolutions detected by the revolutions detector is not lower than the sixth threshold value continues for a second predetermined time. Based on the determinations described above, it is possible to detect an abnormality in the engine generator more accurately.

Preferably, the engine generator further includes a DC voltage detector that detects a DC voltage outputted from the converter. With this arrangement, the abnormality detector determines that there is an abnormality in the engine generator if the voltage detected by the DC voltage detector is not lower than a seventh threshold value. If a voltage detected by the DC voltage detector is an over voltage, it is probable that there is some abnormality in the engine generator, i.e., it is likely that a thyristor in the converter is shorted. Therefore, it is possible to detect an abnormality in the engine generator at a high accuracy by determining that there is an abnormality in the engine generator when the voltage detected by the DC voltage detector is not lower than the seventh threshold value.

Herein, the term "duty ratio" is a term for a signal in which "H" and "L" are repeated cyclically, and refers to a ratio between "H" time and "L" time within one cycle. For example, "a duty ratio of a voltage detected by the input voltage detector" may be indicated by (L time)/{(L time)+(H time)}, where "H" represents the detected voltage which is not higher than 0, and "L" represents the detected voltage which is higher than 0.

The term "information regarding duty ratio" refers to information interrelated to the duty ratio, and includes the duty ratio itself, a duty ratio change rate, and so on.

The term "duty ratio change rate (%)" is indicated by {(duty ratio at a time point after a given time point)/(duty ratio at the given time point)}×100.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 2 is a waveform chart which shows R-S line voltage waveforms and rectangular detected signal forms after AD conversion of the R-S line voltages.

FIG. 13 is a graph which shows an electric-current characteristic in parallel operation.

FIG. 14 is a graph which shows duty ratio change rates and abnormality detection threshold values during a normal operation and during a diode short incident, in parallel operation.

FIG. 15 is a graph which shows abnormality detection ranges in parallel operation.

DETAILED DESCRIPTION OF THE PREFERRED EMBODIMENTS

Hereinafter, preferred embodiments of the present invention will be described with reference to the drawings.

Figure 1:
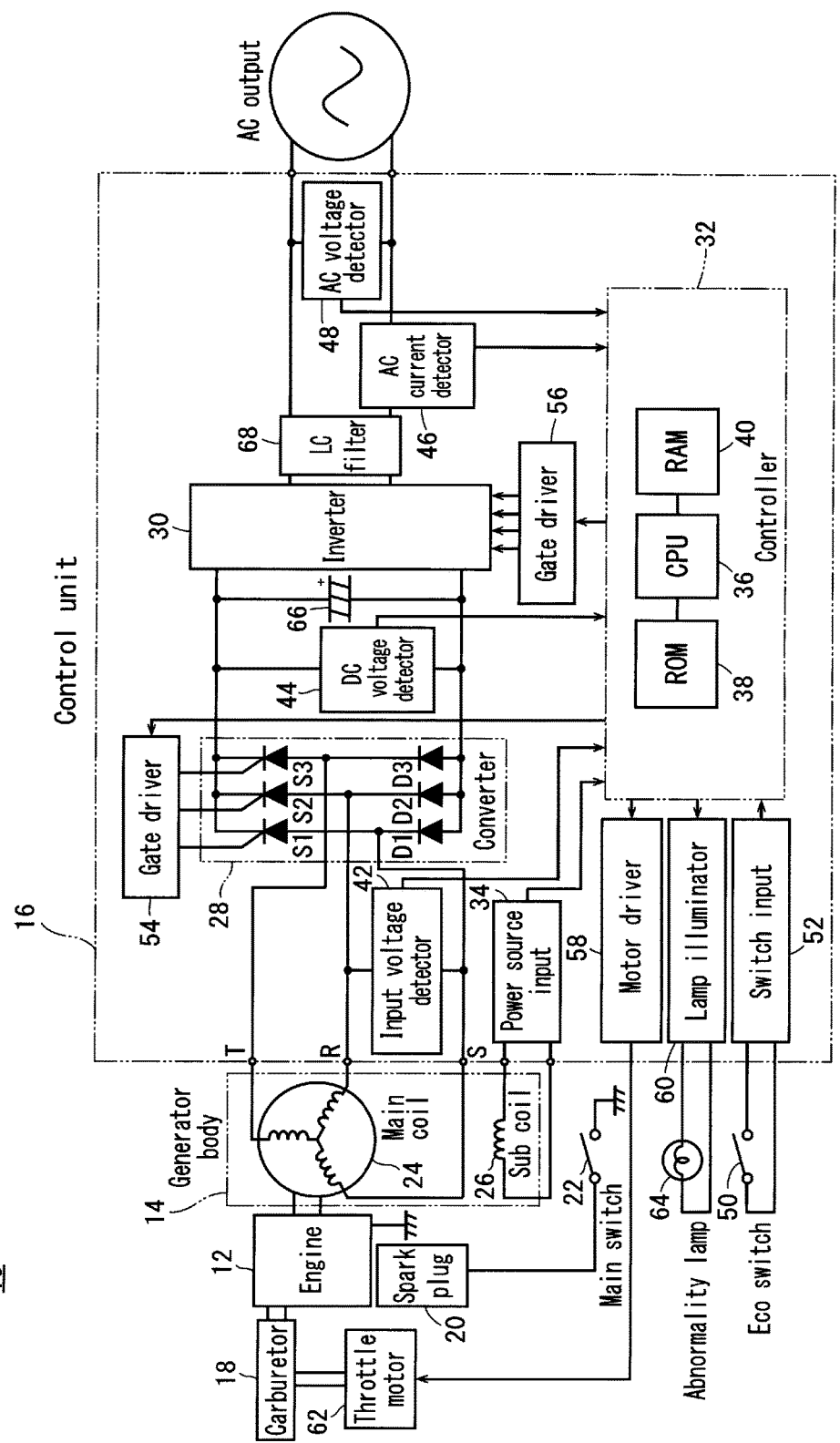
FIG. 1 is a block diagram which shows an engine generator (single-machine) according to a preferred embodiment of the present invention.

Referring to FIG. 1, an engine generator 10 according to a preferred embodiment of the present invention includes an engine 12, a generator body 14, and a control unit 16.

The engine 12 is supplied with a fuel-gas mixture from a carburetor 18, and the fuel-gas mixture inside the engine 12 is ignited by spark discharge from a spark plug 20. The spark plug 20 is connected to a main switch 22, and the spark plug 20 is turned ON/OFF with the main switch 22.

The generator body 14 is connected to the engine 12, and includes a main coil 24 having three-phase (R-, S- and T-phase) output windings, and a sub coil 26. The generator body 14 is driven by the engine 12, and generates AC power in each of the main coil 24 and the sub coil 26 in accordance with the number of revolutions of the engine 12.

The control unit 16 includes a converter 28, an inverter 30, a controller 32, and a power source input 34.

The converter 28 includes a plurality of rectifiers, i.e., three diodes D1, D2, D3 and three thyristors S1, S2, S3 which define a full-wave rectification hybrid-bridge circuit. The main coil 24, which includes the three-phase output windings of the generator body 14, is connected to the converter 28, and the output from the generator body 14 undergoes DC conversion (rectification) by the converter 28. The converter 28 has its output side connected to the inverter 30. The inverter 30 includes a plurality of rectifiers (not illustrated) to perform AC conversion of the output from the converter 28. The controller 32 includes a CPU 36 configured or programmed to perform necessary arithmetic operations and control of the engine generator 10; a ROM 38 that stores programs and data to control the engine generator 10; and a RAM 40 that stores arithmetic operation data and so on. The ROM 38 stores, for example, two-dimensional maps which define relationships between AC current and the engine's number of revolutions in an economical mode (electric power saving mode) and in an ordinary mode; two-dimensional maps which define relationships between AC current and AC voltage; first through seventh threshold values; a first predetermined time and a second predetermined time; first through sixth predetermined values; etc. The relationships include: the first threshold value<the third threshold value, the fifth threshold value<the second predetermined value<the seventh threshold value, the second predetermined value>the third predetermined value, and the sixth predetermined value>the seventh predetermined value.

The sub coil 26 serves as a power source for the control unit 16. When the engine 12 starts and its number of revolutions increases to approximately 2,500 rpm, for example, electric power is supplied to the controller 32 from the power source input 34 which is connected to the sub coil 26, and the control unit 16 is started. When the main switch 22 is turned OFF, spark discharge of the spark plug 20 is stopped, and as the number of revolutions of the engine 12 decreases to approximately 2,000 rpm, for example, electric power supply from the power source input 34 to the controller 32 ceases. This stops the control unit 16, and stops the engine 12.

An input voltage detector 42 is provided across R-S lines between the generator body 14 and the converter 28. The input voltage detector 42 detects an R-S line voltage which is an input signal from the generator body 14 to the converter 28. The R-S line voltage is converted into a rectangular detection signal and inputted to the controller 32. The R-S line voltage and the detection signal obtained at the input voltage detector 42 are like those shown in FIG. 2, for example.

When the engine generator 10 is in its no-load, normal operation (does not output AC power during normal operation), the input voltage detector 42 detects an R-S line voltage as shown in FIG. 2(a), and the detected voltage is converted into a rectangular detection signal as shown in FIG. 2(b). Since there is no load consumption under the no-load operation, the R-S line voltage appears as an approximate sine wave. The detection signal has a duty ratio of approximately 50%, for example.

When the engine generator 10 is in its loaded, normal operation (outputs AC power during normal operation), the input voltage detector 42 detects an R-S line voltage as shown in FIG. 2(c), and the detected voltage is converted into a rectangular detection signal as shown in FIG. 2(d). In the loaded normal operation, the R-S line voltage has a rectangular wave. The detection signal has a duty ratio smaller than approximately 50%, for example.

When the engine generator 10 is in its no-load operation with the S-phase diode (diode D1) in a shorted condition, the input voltage detector 42 detects an R-S line voltage as shown in FIG. 2(e), and the detected voltage is converted into a rectangular detection signal as shown in FIG. 2(f). Because of the shorted S-phase diode, there is a change in the R-S line voltage waveform, and the detection signal's duty ratio is also changed to approximately 25%, for example.

When the engine generator 10 is in its loaded operation with the S-phase diode (diode D1) in a shorted condition, the input voltage detector 42 detects an R-S line voltage as shown in FIG. 2(g), and the detected voltage is converted into a rectangular detection signal as shown in FIG. 2(h). When the S-phase diode is shorted, the R-S line voltage waveform changes with respect to the waveform in the no-load operation due to power supply to the thyristors S1, S2, S3, and the detection signal's duty ratio increases with respect to the value in the no-load operation.

It should be noted here that in the conversion process from the R-S line voltage (input voltage) to the rectangular detection signal, input voltages not higher than 0 are converted into "H" detection signals, whereas input voltages higher than 0 are converted into "L" detection signals. In the CPU 36, the obtained rectangular detection signal is used to obtain a duty ratio of the voltage detected by the input voltage detector 42 by calculating (L time)/{(L time)+(H time)}. Also in the CPU 36, "duty ratio change rate (%)" is obtained by calculating {(duty ratio at a time point after a given time point)/(duty ratio at the given time point)}×100. A time interval between "a given time point" and "a time point after the given time point" is, for example, 0.1 second or so.

Returning to FIG. 1, a DC voltage detector 44 is provided on the output side of the converter 28, whereas an AC current detector 46 and an AC voltage detector 48 are provided on the output side of the inverter 30. The DC voltage detector 44 detects a DC voltage outputted from the converter 28. The AC current detector 46 detects an AC current (machine current) outputted from the inverter 30. The AC voltage detector 48 detects an AC voltage outputted from the inverter 30. These detected voltages/detected current are inputted to the controller 32. When an eco switch 50 is turned ON, the engine generator is set to economical mode, and when the eco switch is turned OFF, the engine generator is set to ordinary mode. The selected mode is notified to the controller 32 via a switch input 52. The engine's number of revolutions is set to a minimum of 3,000 rpm in the economical mode versus a minimum of 4,500 rpm in the ordinary mode, for example.

Based on the inputted information, the controller 32 controls the engine generator 10. The controller 32 controls a gate driver 54, which controls switching procedures of the thyristors S1, S2, S3 in the converter 28. The controller 32 controls a gate driver 56 which controls switching procedures of the plurality of rectifiers in the inverter 30. The controller 32 also controls a motor driver 58 and a lamp illuminator 60. The motor driver 58 drives a throttle motor 62, and the throttle motor 62 adjusts an opening degree of a throttle (not illustrated) in the carburetor 18. The lamp illuminator 60 controls turning ON/OFF of an abnormality lamp 64.

Further, a smoothing capacitor 66 is provided between the converter 28 and the inverter 30. The smoothing capacitor 66 smoothens the DC voltage from the converter 28. Also, an LC filter 68 is provided on the output side of the inverter 30. The LC filter 68 filters the AC output from the inverter 30 and then outputs a result. It should be noted here that the AC output from the engine generator 10 is stopped if there is detected an abnormality in the engine generator 10 indicated by the duty ratio or other indicators which will be described below.

In the present preferred embodiment, the controller 32 includes the abnormality detector and the revolutions detector.

Figure 3:
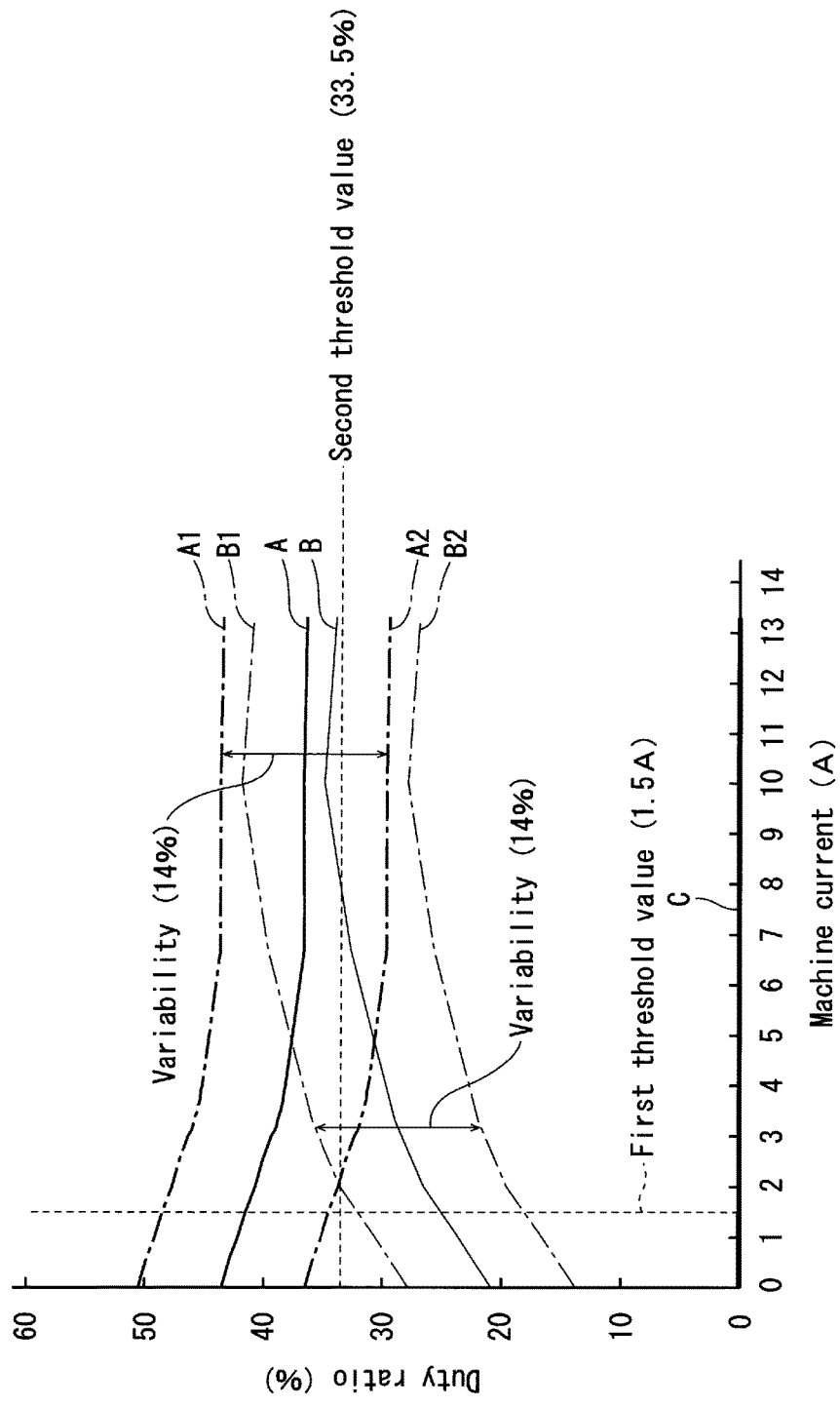
FIG. 3 is a graph which shows duty ratios and abnormality detection threshold values during a normal operation and during a diode short incident, in a single-machine operation.

In FIG. 3, Line A shows a duty ratio during normal operation, Lines A1 and A2 show an upper limit value and a lower limit value of the duty ratio respectively during normal operation. Line B shows a duty ratio when the diode (S-phase or T-phase) in the converter 28 is shorted. Lines B1 and B2 show an upper limit value and a lower limit value of the duty ratio when the diode (S-phase or T-phase) is shorted, respectively. Line C shows a duty ratio when the diode (R-phase) in the converter 28 is shorted.

As understood from Lines A, B, and C, a difference between the duty ratio during normal operation and the duty ratio during a diode short incident is large in a range where the machine current (load current) detected by the AC current detector 46 is small. In the range where the machine current (load current) is small, the lower limit value of the duty ratio during normal operation indicated by Line A2 is greater than the upper limit value of the duty ratio indicated by Line B1 for the case where the diode (S-phase or T-phase) is shorted and the duty ratio indicated by Line C for the case where the diode (R-phase) is shorted. Specifically, the difference (variability) between the upper limit value and the lower limit value of the duty ratio is approximately 14% (±7%), for example, and in the range where the machine current (load current) is not greater than 1.5 A, for example, setting a duty ratio threshold value to 33.5%, for example, makes it possible to differentiate between the duty ratio during normal operation and the duty ratio during a diode short incident even if the duty ratio is subject to variability. In this example, 1.5 A represents the first threshold value, 33.5% represents the second threshold value, and if the machine current (load current) is not higher than 1.5 A and the duty ratio is not higher than 33.5%, for example, it is determined that there is an abnormality in the engine generator 10. It should be noted here that a reason why the duty ratio has an upper limit value and a lower limit value (has variability) is that the generator body 14 has variability in its output capability, electronic elements which define the input voltage detector 42 have variability in their performance, and these variabilities etc. cause errors in the signal conversion process.

Figure 4:
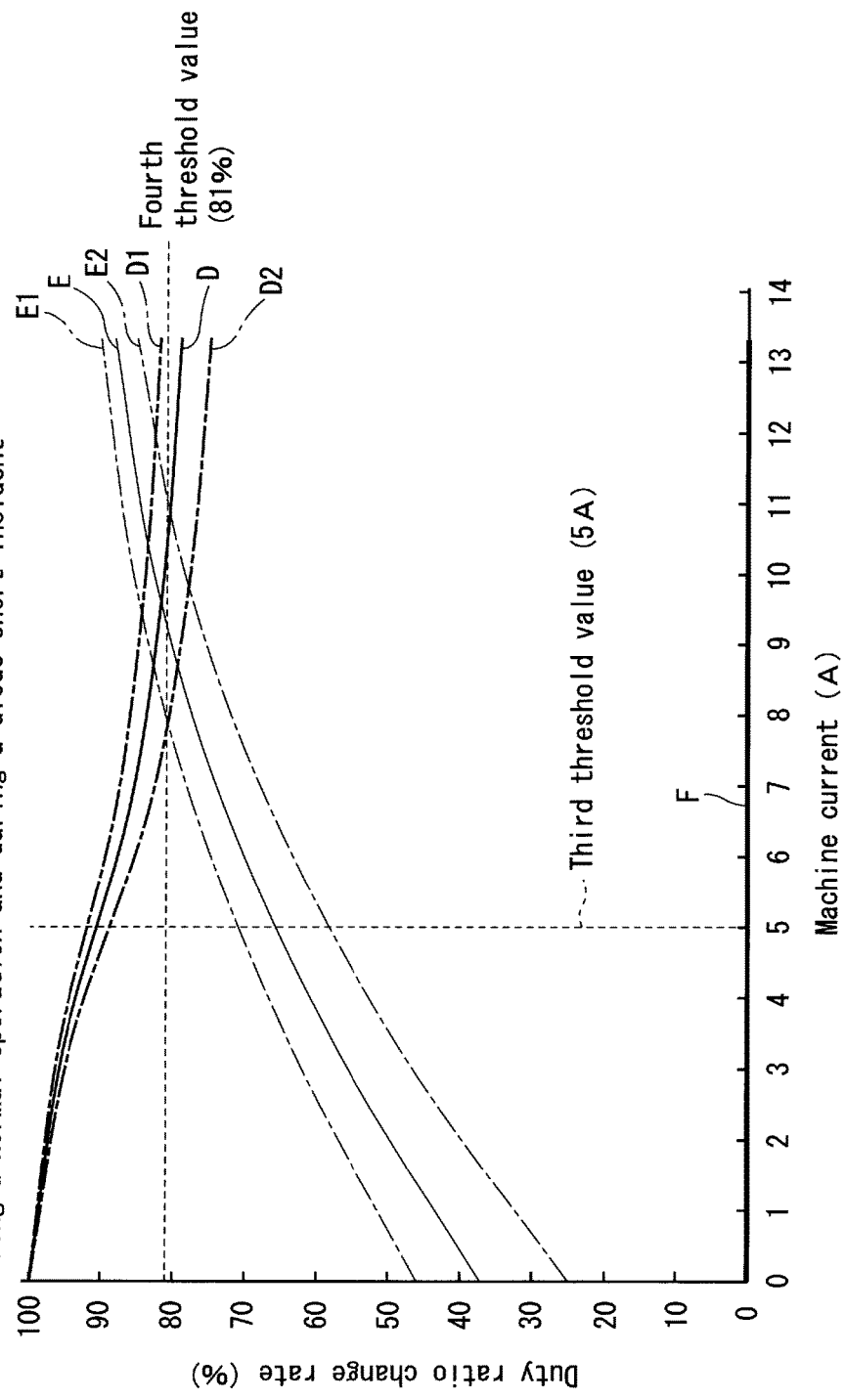
FIG. 4 is a graph which shows duty ratio change rates and abnormality detection threshold values during a normal operation and during a diode short incident, in a single-machine operation.

In FIG. 4, Line D shows a duty ratio change rate during normal operation, Lines D1 and D2 show an upper limit value and a lower limit value of the duty ratio change rate, respectively, during normal operation. Line E shows a duty ratio change rate when the diode (S-phase or T-phase) in the converter 28 is shorted. Lines E1, E2 show an upper limit value and a lower limit value, respectively, of the duty ratio change rate when the diode (S-phase or T-phase) is shorted. Line F shows a duty ratio change rate when the diode (R-phase) in the converter 28 is shorted.

As understood from Lines D, E, and F, a difference between the duty ratio change rate during normal operation and the duty ratio change rate during a diode short incident is large in a range where the machine current (load current) detected by the AC current detector 46 is small. In the range where the machine current (load current) is small, the lower limit value of the duty ratio change rate during normal operation indicated by Line D2 is greater than the upper limit value of the duty ratio change rate indicated by Line E1 for the case where the diode (S-phase or T-phase) is shorted and the duty ratio change rate indicated by Line F for the case where the diode (R-phase) is shorted. Specifically, in the range where the machine current (load current) is not greater than 5 A, for example, setting a duty ratio change rate threshold value to 81%, for example, makes it possible to discriminate between the duty ratio change rate during normal operation and the duty ratio change rate during a diode short incident even if the duty ratio change rate is subject to variability. In this example, 5 A represents the third threshold value, 81% represents the fourth threshold value, and if the machine current (load current+cross flow) is not greater than 5 A and the duty ratio change rate is not greater than 81%, it is determined that there is an abnormality in the engine generator 10. It should be noted here that, in this example, the variability of the duty ratio change rate is calculated on the basis of the duty ratio variability±7% shown in FIG. 3.

Figure 5:
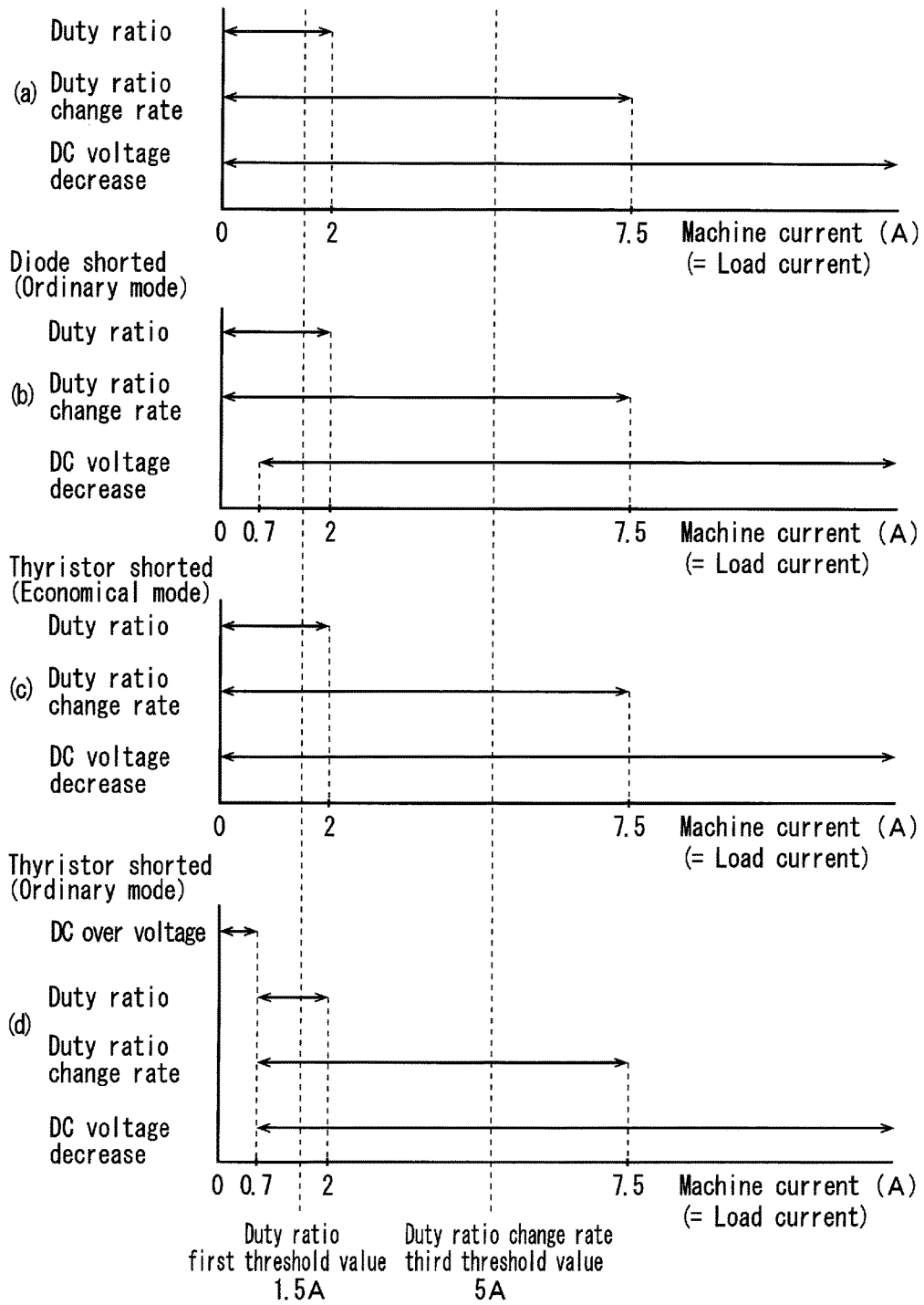
FIG. 5 is a graph which shows abnormality detection ranges in a single-machine operation.

FIG. 5 shows abnormality detection ranges for the single-machine engine generator 10 described above.

Referring to FIG. 5(*a*), when the converter 28 has its diode shorted (economical mode), an abnormality detection range based on duty ratio is a range where the machine current (load current) is 0 A through 2 A, for example; an abnormality detection range based on duty ratio change rate is a range where the machine current (load current) is 0 A through 7.5 A, for example; and an abnormality detection range based on DC voltage decrease is a range where the machine current (load current) is 0 A through a maximum current.

Referring to FIG. 5(*b*), when the converter 28 has its diode shorted (ordinary mode), an abnormality detection range based on duty ratio is a range where the machine current (load current) is 0 A through 2 A, for example; an abnormality detection range based on duty ratio change rate is a range where the machine current (load current) is 0 A through 7.5 A, for example; and an abnormality detection range based on DC voltage decrease is a range where the machine current (load current) is, for example, 0.7 A through a maximum current. Therefore, when the machine current (load current) is not in the abnormality detection range based on a DC voltage decrease, and is not smaller than 0 A and smaller than 0.7 A, it is possible to detect an abnormality of the engine generator 10 by using the abnormality detection based on duty ratio and the abnormality detection based on duty ratio change rate.

Referring to FIG. 5(*c*), when the converter 28 has its thyristor shorted (economical mode), an abnormality detection range based on duty ratio is a range where the machine current (load current) is 0 A through 2 A, for example; an abnormality detection range based on duty ratio change rate is a range where the machine current (load current) is 0 A through 7.5 A, for example; and an abnormality detection range based on a DC voltage decrease is a range where the machine current (load current) is, for example, 0 A through the maximum current.

Referring to FIG. 5(*d*), when the converter 28 has its thyristor shorted (ordinary mode), an abnormality detection range based on DC over voltage is a range where the machine current (load current) is 0 A through 0.7 A, for example; an abnormality detection range based on duty ratio is a range where the machine current (load current) is 0.7 A through 2 A, for example; an abnormality detection range based on duty ratio change rate is a range where the machine current (load current) is 0.7 A through 7.5 A, for example; and an abnormality detection range based on DC voltage decrease is a range where the machine current (load current) is, for example, 0.7 A through the maximum current.

Now, if the first threshold value of the duty ratio and the third threshold value of the duty ratio change rate are set to conservative values of, for example, 1.5 A and 5 A, respectively, the abnormality detection range based on duty ratio has an actual upper limit value of 1.5 A, whereas the abnormality detection range based on duty ratio change rate has an actual upper limit value of 5 A. In this case, if the machine current (load current) is not greater than 5 A, it is possible to improve abnormality detection accuracy of the engine generator 10 by using the abnormality detection based on duty ratio change rate and the abnormality detection based on DC voltage decrease. Also, if the machine current (load current) is not greater than 1.5 A, it is possible to further improve abnormality detection accuracy of the engine generator 10 by using the abnormality detection based on duty ratio, the abnormality detection based on duty ratio change rate, and the abnormality detection based on DC voltage decrease.

In a case where the thyristor is shorted (ordinary mode) under a low-load condition (when the machine current (load current) detected by the AC current detector 46 is small), the engine's number of revolutions is high and, therefore, the generated voltage (input voltage) is high but the load is not capable of consuming a sufficient amount of electric power. As a result, electricity is charged in the smoothing capacitor 66 on the output side of the converter 28, causing an over voltage in the DC voltage detected by the DC voltage detector 44. Therefore, it is reasonable to think that an abnormality detection based on DC over voltage takes place when the thyristor is shorted (ordinary mode) under a condition that the machine current (load current) is 0 A through 0.7 A. In the economical mode in which the engine's number of revolutions is low and there is a small amount of input energy, or in cases where there is a large load, the load consumes a sufficient amount of electric power, so the smoothing capacitor 66 is not charged to the threshold value at which an abnormality is detected.

Next, operation of the engine generator 10 will be described with reference to FIG. 6 through FIG. 11.

Figure 6:
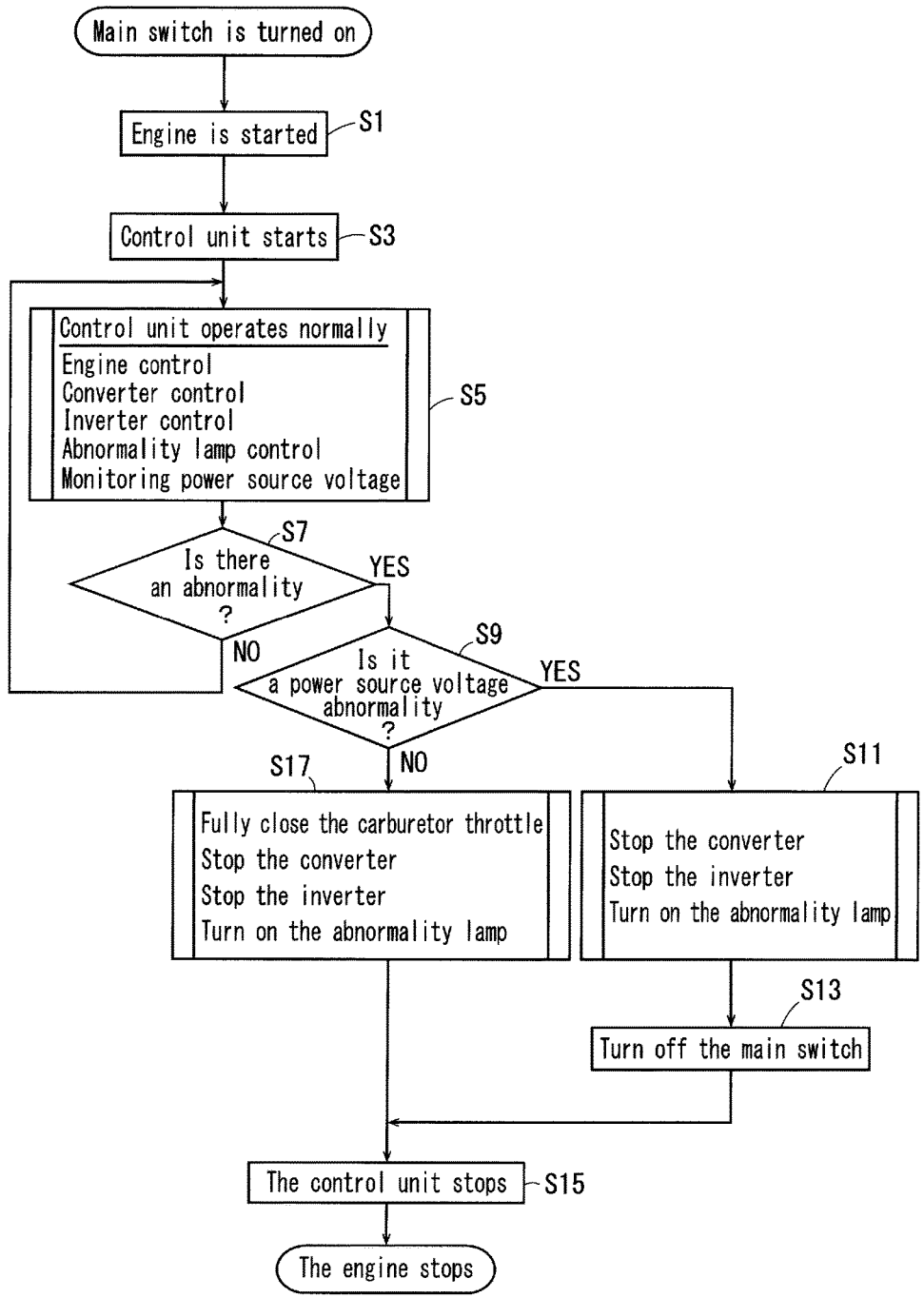
FIG. 6 is a flowchart which shows an example of a procedure relating to start/operation/stop of the engine generator (single-machine) in FIG. 1 and of an engine generator (parallel connection) in FIG. 12.

Referring to FIG. 6, a start/operation/stop procedure of the engine generator 10 will be described.

First, the user turns ON the main switch 22 to enable spark discharge by the spark plug 20. The user then starts the engine 12 by using a recoil starter, a cell motor, etc. of the engine 12 (Step S1). As the number of revolutions of the engine 12 increases to approximately 2,500 rpm, for example, the power source input 34 which is connected to the sub coil 26 supplies electric power to the controller 32 to start the control unit 16 (Step S3), and the control unit 16 reaches normal operation (Step S5). In this process, the controller 32 controls the engine 12, the converter 28, the inverter 30, and the abnormality lamp 64, while monitoring the power source voltage, i.e., the output from the power source input 34.

The controller 32 determines whether or not there is an abnormality in the engine generator 10 (Step S7). If there is no abnormality, the process returns to Step S5. On the other hand, if an abnormality is discovered in the engine generator 10, the controller 32 determines whether or not there is an abnormality in the power source voltage (Step S9). If there is an abnormality in the power source voltage, the controller 32 stops the converter 28 and the inverter 30, and turns ON the abnormality lamp 64 (Step S11). Thereafter, the user turns OFF the main switch 22 (Step S13). This disables spark discharge by the spark plug 20, and as the number of revolutions of the engine 12 decreases to approximately 2,000 rpm, for example, electric power supply from the power source input 34 to the controller 32 ceases, to stop the control unit 16 (Step S15), and the engine 12 comes to a stop. As described, when there is detected an abnormality of the power source voltage due to an abnormality in the sub coil 26 or a failure of the power source input 34, the throttle of the carburetor 18 is not completely closed, and the engine 12 is brought to stop by the user.

If, on the other hand, Step S9 determines that there is no abnormality in the power source voltage, the controller 32 completely closes the throttle of the carburetor 18; stops the converter 28 and the inverter 30; and turns ON the abnormality lamp 64 (Step S17). As the number of revolutions of the engine 12 decreases to approximately 2,000 rpm, for example, electric power supply from the power source input 34 to the controller 32 ceases, the control unit 16 comes to a stop in Step S15, and the engine 12 comes to a stop.

It should be noted here that when the engine generator 10 is stopped during normal operation, the user turns OFF the main switch 22. This stops spark discharge of the spark plug 20, and as the number of revolutions of the engine 12 decreases to approximately 2,000 rpm, for example, electric power supply from the power source input 34 to the controller 32 ceases, upon which the controller 32 detects an abnormality of the power source voltage, stops the converter 28 and the inverter 30, and then stops the engine 12.

Figure 7:
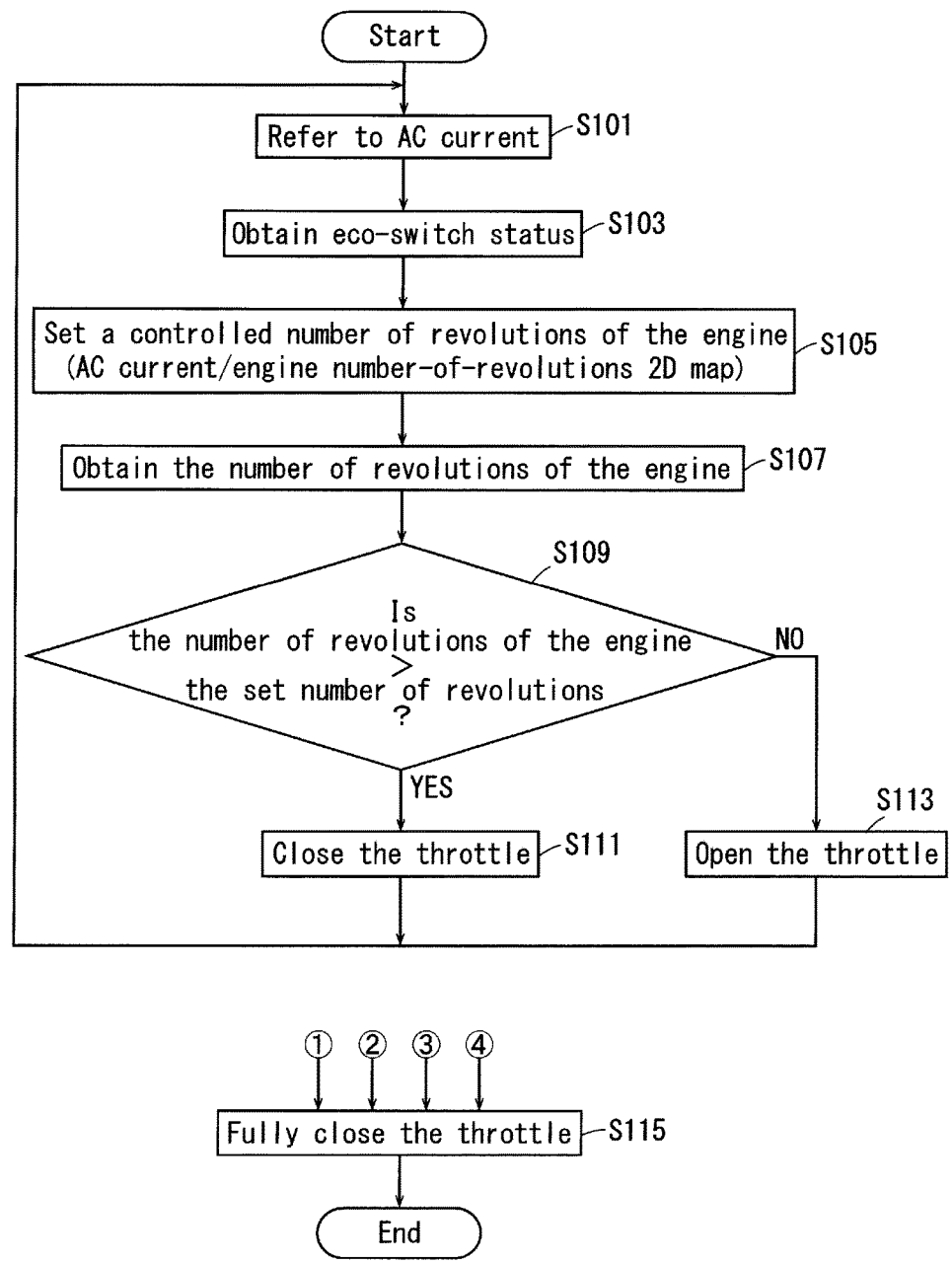
FIG. 7 is a flowchart which shows an example of an engine control procedure.

Referring to FIG. 7, description will be made for a controlling procedure of the engine 12 shown in Steps S5 and S17 in FIG. 6.

First, inquiry is made by the controller 32 for an AC current detected by the AC current detector 46 (Step S101) and to determine a state of the eco switch 50, i.e., whether the mode is the economical mode or the ordinary mode (Step S103). Next, inquiry is made by the controller 32 for the two-dimensional map which shows a relationship between AC current and the engine's number of revolutions of the identified mode, and the number of revolutions of the engine 12 is set (Step S105). Then, an actual number of revolutions of the engine 12 is obtained (Step S107). In the present preferred embodiment, the number of revolutions of the engine 12 is obtained by the controller 32 based on a detection signal supplied from the input voltage detector 42.

Thereafter, the controller 32 determines whether or not the obtained actual number of revolutions of the engine 12 is greater than the set number of revolutions of the engine 12 (Step S109). If the actual number of revolutions is greater than the set number of revolutions, the throttle of the carburetor 18 is further closed to decrease the number of revolutions of the engine 12 (Step S111), and the control process returns to Step S101. On the other hand, if the actual number of revolutions is not greater than the set number of revolutions, the throttle of the carburetor 18 is further opened to increase the number of revolutions of the engine 12 (Step S113), and the control process returns to Step S101.

It should be noted here that, as will be described below in converter control with reference to FIG. 8, if an abnormality based on a DC voltage decrease is determined (Step S217), or an abnormality based on a DC over voltage is determined (Step S223), or an abnormality based on a duty ratio is determined (Step S235), or an abnormality based on a duty ratio change rate is determined (Step S245), the throttle of the carburetor 18 is completely closed (Step S115), and the process comes to an end.

Figure 8:
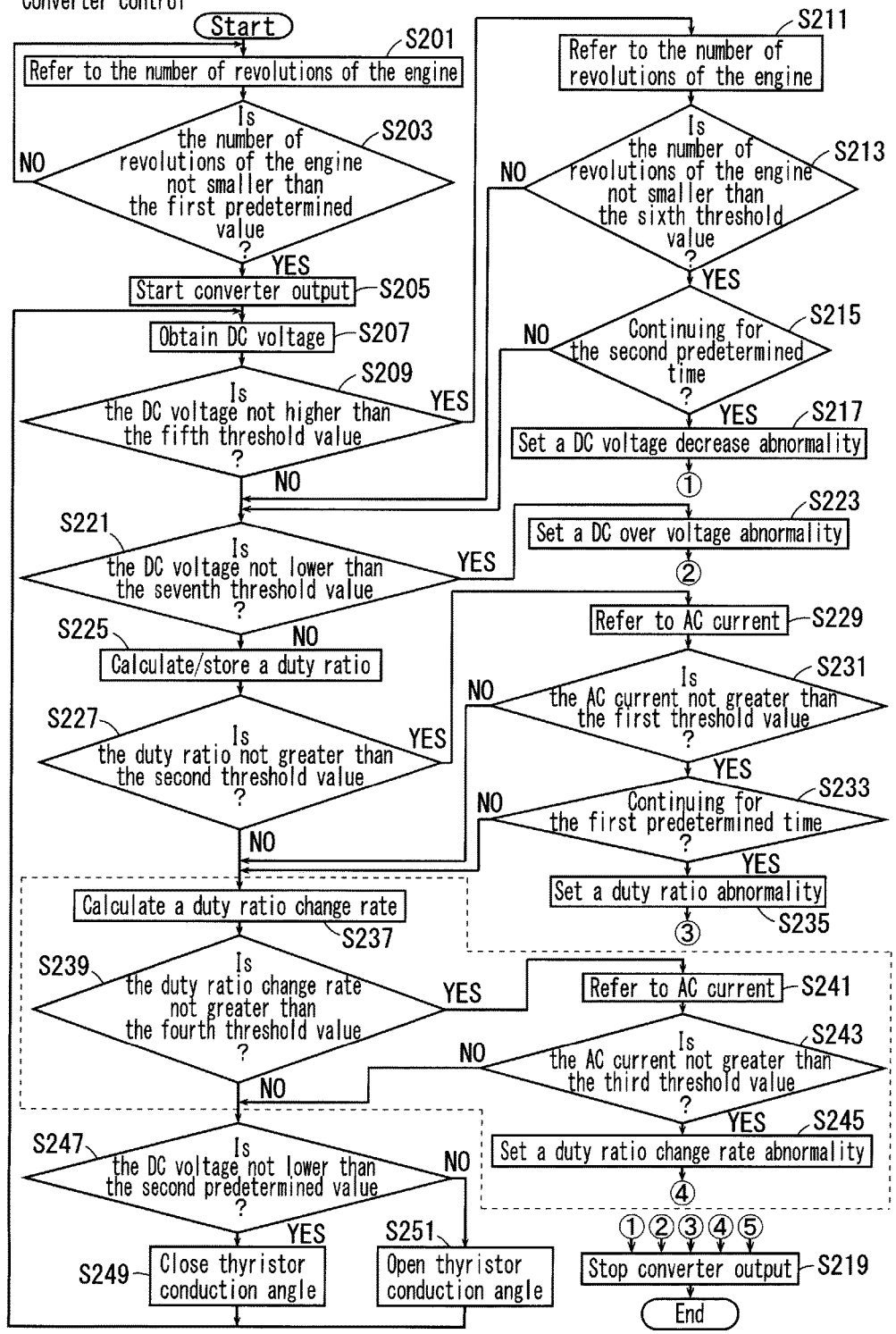
FIG. 8 is a flowchart which shows an example of a converter control procedure.

Referring to FIG. 8, description will be made for a control procedure of the converter 28 shown in Steps S5, S11, and S17 in FIG. 6.

First, inquiry is made by the controller 32 for an actual number of revolutions of the engine 12 (Step S201), and to determine whether or not the number of revolutions of the engine 12 is not smaller than the first predetermined value (2,800 rpm in the present preferred embodiment) (Step S203). If the number of revolutions of the engine 12 is smaller than the first predetermined value, the control process returns to Step S201. On the other hand, if the number of revolutions of the engine 12 is not smaller than the first predetermined value, the controller 32 causes the gate driver 54 to start outputting from the converter 28 (Step S205), and the controller 32 obtains a DC voltage detected by the DC voltage detector 44 (Step S207). Then, the controller 32 determines whether or not the DC voltage is not greater than the fifth threshold value (140V in the present preferred embodiment) (Step S209). If the DC voltage is not greater than the fifth threshold value, inquiry is made for the number of revolutions of the engine 12 (Step S211), and to determine whether or not the number of revolutions of the engine 12 is not smaller than the sixth threshold value (which is, for example, 100 rpm smaller than the number of revolutions of the engine 12 set in Step S105 in the present preferred embodiment) (Step S213). If the number of revolutions of the engine 12 is not smaller than the sixth threshold value, determination is made as to whether or not the state in which the DC voltage is not greater than the fifth threshold value and the number of revolutions of the engine 12 is not smaller than the sixth threshold value is continuing for the second predetermined time (5 seconds in the present preferred embodiment) (Step S215). If this state continues for the second predetermined time, an abnormality based on a DC voltage decrease is determined (Step S217), the output from the converter 28 is stopped (Step S219), and the process comes to an end.

On the other hand, if Step S209 determines that the DC voltage is greater than the fifth threshold value, the process goes to Step S221. If Step S213 or Step S215 determines NO in their determination, the process also goes to Step S221.

In Step S221, the controller 32 determines whether or not the DC voltage is not lower than the seventh threshold value (200V in the present preferred embodiment). If the DC voltage is not lower than the seventh threshold value, the controller 32 determines that there is an abnormality based on a DC over voltage (Step S223), the output from the converter 28 is stopped in Step S219, and the process comes to an end.

On the other hand, if Step S221 determines that the DC voltage is lower than the seventh threshold value, the controller 32 calculates a duty ratio of the input voltage detected by the input voltage detector 42, and stores the duty ratio value in the RAM 40 (Step S225), and the controller 32 determines whether or not this duty ratio is not greater than the second threshold value (for example, 33.5% in the present preferred embodiment) (Step S227). If the duty ratio is not greater than the second threshold value, inquiry is made by the controller 32 for an AC current detected by the AC current detector 46 (Step S229) to determine whether or not the detected AC current is not greater than the first threshold value (for example, 1.5 A in the present preferred embodiment) (Step S231). If the AC current is not greater than the first threshold value, determination is made as to whether or not the state in which the duty ratio is not greater than the second threshold value and the AC current is not greater than the first threshold value is continuing for the first predetermined time (for example, 5 seconds in the present preferred embodiment) (Step S233). If this state continues for the first predetermined time, the controller 32 determines that there is an abnormality based on the duty ratio (Step S235), Step S219 stops output from the converter 28, and the process comes to an end.

On the other hand, if Step S227 determines that the duty ratio is greater than the second threshold value, the process goes to Step S237. If the result of the determination in Step S231 or Step S233 is NO, the process also goes to Step S237.

In Step S237, the controller 32 calculates a duty ratio change rate. In Step S239, the controller 32 determines whether or not the duty ratio change rate is not greater than the fourth threshold value (for example, 81% in the present preferred embodiment). If the duty ratio change rate is not greater than the fourth threshold value, inquiry is made by the controller 32 for an AC current detected by the AC current detector 46 (Step S241) to determine whether or not the detected AC current is not greater than the third threshold value (for example, 5 A in the present preferred embodiment) (Step S243). If the AC current is not greater than the third threshold value, the controller 32 determines that there is an abnormality based on duty ratio change rate (Step S245), output from the converter 28 is stopped in Step S219, and the process comes to an end.

On the other hand, if Step S239 determines that the duty ratio change rate is greater than the fourth threshold value, the process goes to Step S247. If the result of the determination in Step S243 is NO, the process also goes to Step S247.

In Step S247, the controller 32 determines whether or not the DC voltage detected by the DC voltage detector 44 is not lower than the second predetermined value (175V in the present preferred embodiment). If the detected DC voltage is not lower than the second predetermined value, conduction angles of the thyristors S1, S2, S3 are closed (Step S249), and the process returns to Step S207. On the other hand, if the detected DC voltage is lower than the second predetermined value, the conduction angles of the thyristors S1, S2, S3 are opened (Step S251), and the process returns to Step S207.

It should be noted here that, as will be described below in a power source voltage monitor procedure with reference to FIG. 10, if an abnormality based on power source voltage is determined (Step S405), the output from the converter 28 is stopped in Step S219, and the process comes to an end.

Figure 9:
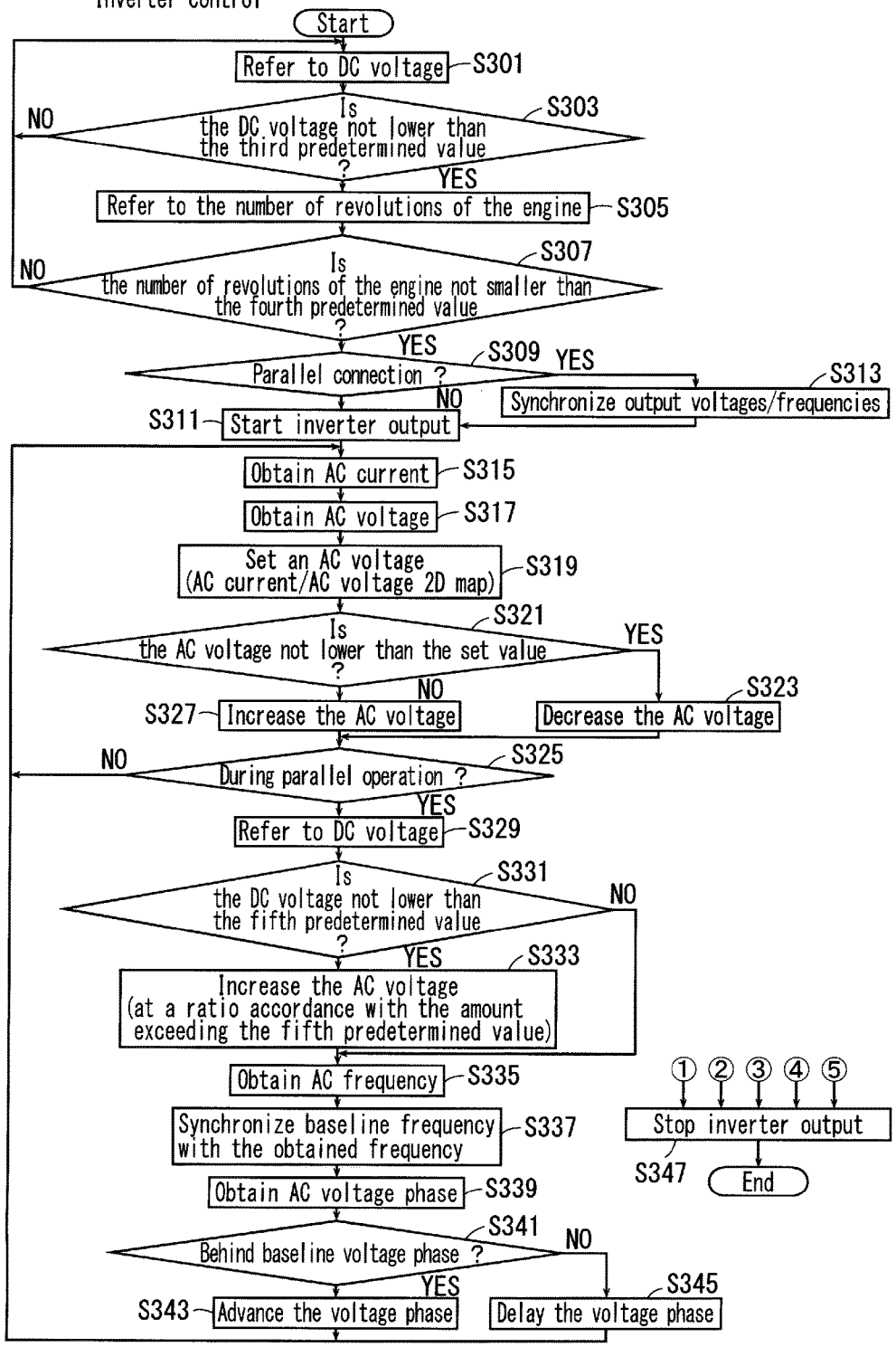
FIG. 9 is a flowchart which shows an example of an inverter control procedure.

Referring to FIG. 9, description will be made of a control procedure of the inverter 30 shown in Steps S5, S11, and S17 in FIG. 6.

First, inquiry is made by the controller 32 for a DC voltage detected by the DC voltage detector 44 (Step S301) to determine whether or not the detected DC voltage is not lower than the third predetermined value (160V in the present preferred embodiment) (Step S303). If the detected DC voltage is lower than the third predetermined value, the process returns to Step S301, whereas if the detected DC voltage is not lower than the third predetermined value, inquiry is made by the controller 32 for the number of revolutions of the engine 12 (Step S305) to determine whether or not the number of revolutions of the engine 12 is not smaller than the fourth predetermined value (for example, 2,800 rpm in the present preferred embodiment) (Step S307). If the number of revolutions of the engine 12 is smaller than the fourth predetermined value, the process returns to Step S301. On the other hand, if the number of revolutions of the engine 12 is not smaller than the fourth predetermined value, the controller 32 determines whether or not the engine generator 10 is in parallel connection with another engine generator (Step S309). If the engine generator 10 is not connected in parallel, i.e., if the generator is used in a single-machine operation, the process goes to Step S311. On the other hand, if the engine generator 10 is connected in parallel, output voltages and frequencies of the engine generators 10 are synchronized (Step S313) and the process goes to Step S311. In Step S311, output from the inverter 30 is started.

Then, the controller 32 obtains an AC current detected by the AC current detector 46 (Step S315), obtains an AC voltage detected by the AC voltage detector 48 (Step S317), and sets an AC voltage by making reference to a two-dimensional map which shows a relationship between AC current and AC voltage (Step S319). The controller 32 determines whether or not the obtained AC voltage is not lower than the set value (Step S321). If the obtained AC voltage is not lower than the set value, the AC voltage to be outputted from the engine generator 10 is decreased (Step S323), and the process goes to Step S325. On the other hand, if the obtained AC voltage is lower than the set value, the AC voltage to be outputted from the engine generator 10 is increased (Step S327), and the process goes to Step S325. In Step S325, determination is made as to whether or not the engine generator 10 is in parallel operation. If the engine generator 10 is not in parallel operation, the process returns to Step S315. On the other hand, if the engine generator 10 is in parallel operation, inquiry is made by the controller 32 for a DC voltage detected by the DC voltage detector 44 (Step S329) to determine whether or not the detected DC voltage is not lower than the fifth predetermined value (for example, 180V in the present preferred embodiment) (Step S331). If the detected DC voltage is not lower than the fifth predetermined value, the AC voltage to be outputted from the engine generator 10 is increased at a ratio corresponding to an amount exceeding the fifth predetermined value (Step S333), and the process goes to Step S335. On the other hand, if Step S331 determines that the detected DC voltage is lower than the fifth predetermined value, the process goes to Step S335. In Step S335, the controller 32 obtains a frequency of the AC voltage detected by the AC voltage detector 48, and sets a baseline frequency to the obtained frequency (Step S337). Then, the controller 32 obtains a phase of the AC voltage detected by the AC voltage detector 48 (Step S339). The controller 32 determines whether or not the phase of the obtained AC voltage is behind a baseline voltage phase (Step S341). If the phase of the obtained AC voltage is behind the baseline voltage phase, the phase of the AC voltage is advanced (Step S343), and the process returns to Step S315. On the other hand, if the phase of the obtained AC voltage is not behind the baseline voltage phase, the phase of the AC voltage is delayed (Step S345), and the process returns to Step S315.

Figure 10:
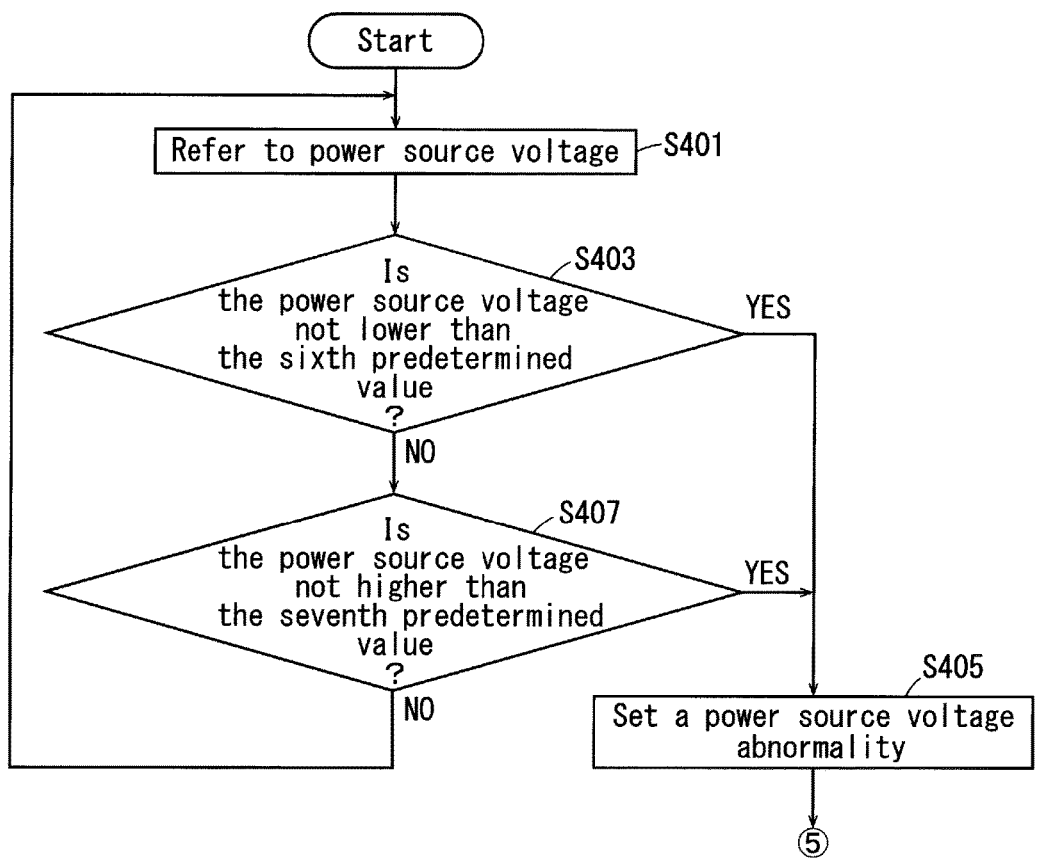
FIG. 10 is a flowchart which shows an example of a power source voltage monitor procedure.

It should be noted here that output from the inverter 30 is stopped (Step S347), and the process comes to an end, if an abnormality based on a DC voltage decrease is determined (Step S217), an abnormality based on DC over voltage is determined (Step S223), an abnormality based on duty ratio is determined (Step S235) or an abnormality based on duty ratio change rate is determined (Step S245), in the converter control shown in FIG. 8; or if an abnormality based on power source voltage is determined (Step S405) in the power source voltage monitor procedure which will be described below with reference to FIG. 10.

Referring to FIG. 10, the power source voltage monitor procedure in Step S5 of FIG. 6 will be described.

First, inquiry is made by the controller 32 for a power source voltage, i.e., an input voltage from the power source input 34 (Step S401) to determine whether or not the power source voltage is not lower than the sixth predetermined value (for example, 15V in the present preferred embodiment) (Step S403). If the power source voltage is not lower than the sixth predetermined value, the process goes to Step S405. On the other hand, if the power source voltage is lower than the sixth predetermined value, determination is made as to whether or not the power source voltage is not higher than the seventh predetermined value (for example, 9V in the present preferred embodiment) (Step S407). If the power source voltage is not higher than the seventh predetermined value, the process goes to Step S405. In Step S405, the controller 32 determines that there is an abnormality based on power source voltage. On the other hand, if Step S407 determines that the power source voltage is higher than the seventh predetermined value, the process returns to Step S401.

Figure 11:
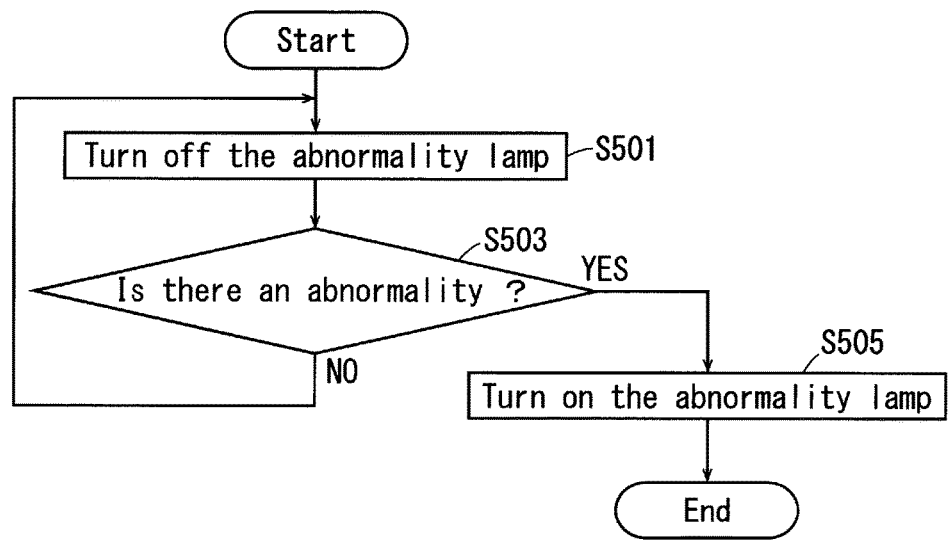
FIG. 11 is a flowchart which shows an example of an abnormality lamp control procedure.

Referring to FIG. 11, a control procedure of the abnormality lamp 64 in Step S5 of FIG. 6 will be described.

First, the controller 32 turns OFF the abnormality lamp 64 (Step S501). The controller 32 determines whether or not there is an abnormality in the engine generator 10 (Step S503). If there is no abnormality, the process returns to Step S501. On the other hand, if there is an abnormality in the engine generator 10, the controller 32 turns ON the abnormality lamp 64 (Step S505), and the process comes to an end.

According to the engine generator 10 described above, an input voltage from the generator body 14 to the converter 28 changes before and after a short (between normal operation and a short incident) of the rectifiers (at least one of the thyristors S1, S2, S3 and diodes D1, D2, D3) which define the converter 28, and therefore, a duty ratio of the input voltage from the generator body 14 to the converter 28, i.e., a duty ratio of a voltage detected by the input voltage detector 42, also changes before and after the short of the rectifier. The difference between the two duty ratios before and after a short is large in a range where the AC current (detected by the AC current detector 46) outputted from the inverter 30 is small. Based on this characteristic, it is possible to appropriately detect an abnormality in the engine generator 10 even if the AC current outputted from the inverter 30 is small when the current detected by the AC current detector 46 is not greater than a threshold value, by determining whether or not there is an abnormality in the engine generator 10 based on information regarding the duty ratio of the voltage detected by the input voltage detector 42. Then, it becomes possible to prevent damage to the generator body 14 due to burning, and so on, by stopping the engine 12 when an abnormality is detected in the engine generator 10.

More specifically, based on the above-described characteristic, it is possible to set the second threshold value which enables discrimination between a before shorting duty ratio and an after shorting duty ratio even if there is variability in each duty ratio before and after a short; and the first threshold value as an upper limit value of the detected current in which the second threshold value enables to discriminate the two duty ratios. By using the first threshold value and the second threshold value as described above, it is possible to determine that there is an abnormality in the engine generator 10 if a current detected by the AC current detector 46 is not greater than the first threshold value and if the duty ratio as compared to the second threshold value falls in an abnormal range (typically indicating a short in a rectifier). In the present preferred embodiment, a duty ratio is in an abnormal range when Step S227 in FIG. 8 determines that the duty ratio is not higher than the second threshold value.

If a state that the current detected by the AC current detector 46 is not higher than the first threshold value and the duty ratio is in the abnormal range based on a comparison with the second threshold value continues for the first predetermined time, it is determined that that there is an abnormality in the engine generator 10. This makes it possible to detect an abnormality in the engine generator 10 with high accuracy.

A difference between the two duty ratio change rates (change rate of the duty ratio of the voltage detected by the input voltage detector 42) before and after a short in a rectifier of the converter 28 is large in a range where the current detected by the AC current detector 46 is small. Based on this characteristic, it is possible to set the fourth threshold value which enables discrimination between a before shorting duty ratio change rate and an after shorting duty ratio change rate even if there is variability in each duty ratio change rate before and after a short; and the third threshold value as an upper limit value of the detected current in which the fourth threshold value enables to discriminate the two duty ratio change rates. By using the third threshold value and the fourth threshold value as described above, it is possible to determine that there is an abnormality in the engine generator 10 if a current detected by the AC current detector 46 is not higher than the third threshold value and if the duty ratio change rate as compared to the fourth threshold value falls in an abnormal range (typically indicating a short in a rectifier). In the present preferred embodiment, a duty ratio change rate is in an abnormal range when Step S239 in FIG. 8 determines that the duty ratio change rate is not higher than the fourth threshold value.

If the DC voltage output from the converter 28 (the voltage detected by the DC voltage detector 44) is low, there is a possibility that a rectifier in the converter 28 is shorted. Therefore, it becomes possible to detect an abnormality in the engine generator 10 more accurately by determining that there is an abnormality in the engine generator 10 when the voltage detected by the DC voltage detector 44 is not higher than the fifth threshold value.

When the engine generator 10 is operating normally, there is an interrelationship between the number of revolutions of the engine 12 and the voltage detected by the DC voltage detector 44. Namely, as the number of revolutions of the engine 12 increases, so does the voltage detected by the DC voltage detector 44. Therefore, if the detected voltage is low when the number of revolutions of the engine 12 is large, it is likely that there is an abnormality in the engine generator 10. Hence, determining that there is an abnormality in the engine generator 10 when the voltage detected by the DC voltage detector 44 is not higher than the fifth threshold value and the engine's number of revolutions detected by the controller 32 is not smaller than the sixth threshold value makes it possible to detect an abnormality in the engine generator 10 accurately in view of the relationship between the number of revolutions of the engine 12 and the voltage detected by the DC voltage detector 44.

It becomes possible to detect abnormality in the engine generator 10 more accurately by determining that there is an abnormality in the engine generator 10 if the state that the voltage detected by the DC voltage detector 44 is not higher than the fifth threshold value and the engine's number of revolutions detected by the controller 32 is not smaller than the sixth threshold value continues for the second predetermined time.

If a voltage detected by the DC voltage detector 44 is an over voltage, it is probable that there is some abnormality in the engine generator 10, i.e., it is likely that at least one of the thyristors S1, S2, S3 in the converter 28 is shorted. Therefore, it is possible to detect an abnormality in the engine generator 10 accurately by determining that there is an abnormality in the engine generator 10 when the voltage detected by the DC voltage detector 44 is not lower than the seventh threshold value. Then, it becomes possible to prevent the inverter 30 from being loaded with an over voltage by stopping the engine 12 when an abnormality is detected in the engine generator 10. This arrangement is effective particularly in the ordinary mode.

Figure 12A:
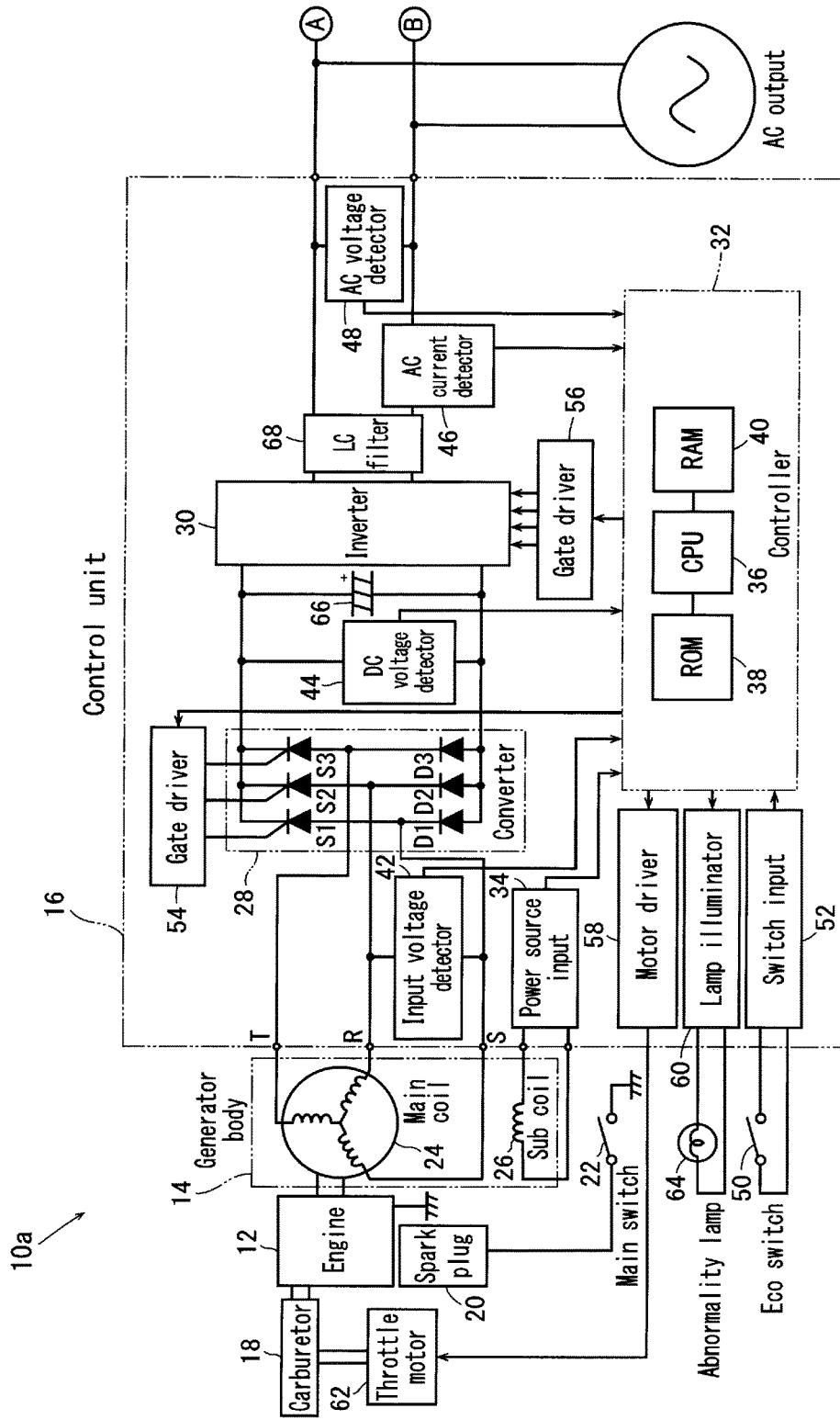
FIGS. 12A and 12B are block diagrams which show two engine generators connected together in parallel according to another preferred embodiment of the present invention.
Figure 12B:
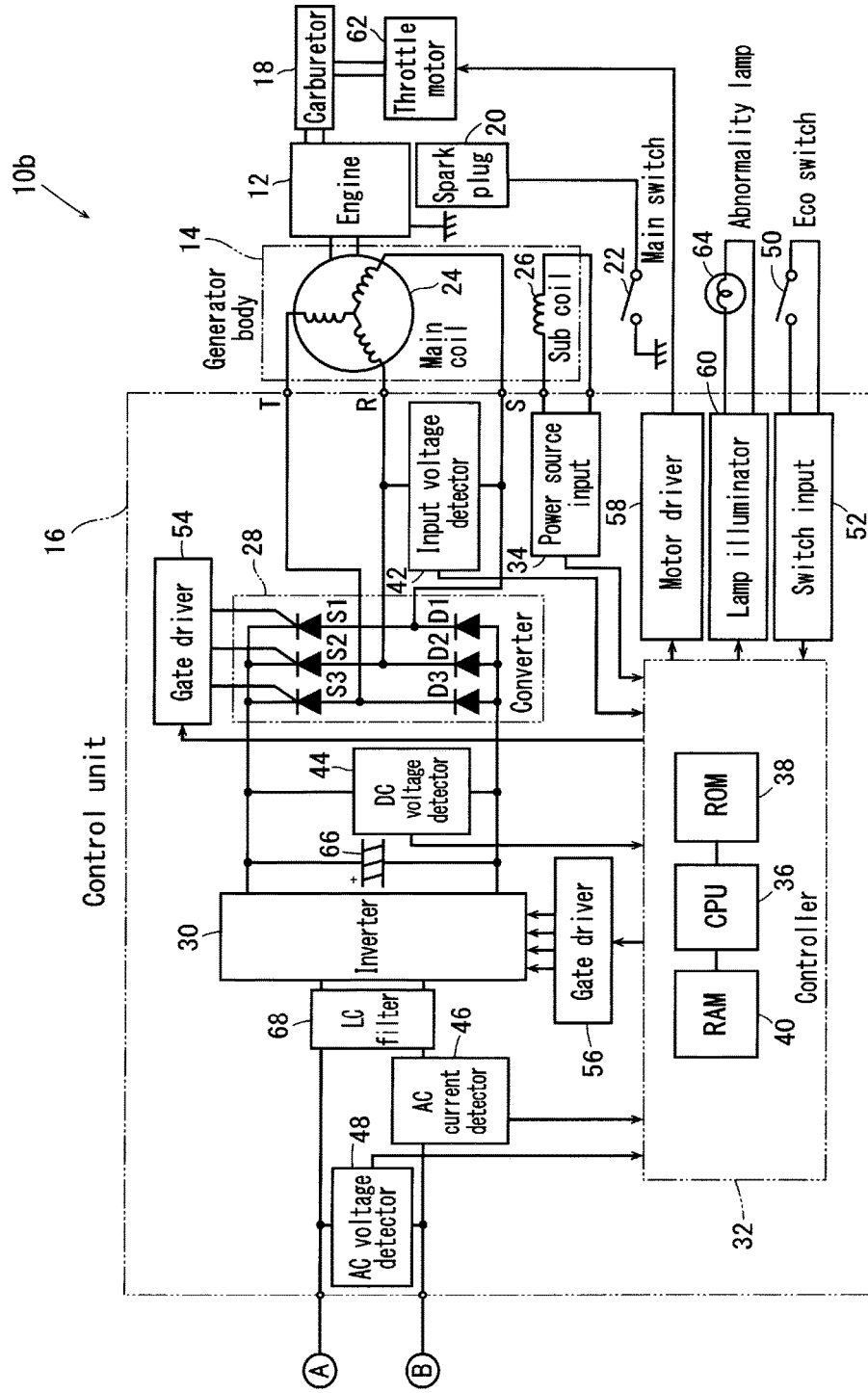

As shown in FIG. 12, the engine generator 10 as described thus far may be connected in parallel with another engine generator. For the sake of descriptive convenience, hereinafter, the engine generator shown in FIG. 12A will be called engine generator 10a, and the engine generator shown in FIG. 12B will be called engine generator 10b.

The engine generators 10a and 10b have their respective output sides connected to each other, and the engine generators 10a, 10b are connected in parallel with a load, to which each of the engine generators 10a, 10b is able to supply its AC output. In other words, when the engine generators 10a, 10b which are connected in parallel are in parallel operation, the load receives a parallel load current.

FIG. 13 shows a relationship between parallel load current, machine current, and cross current in the parallel operation. In FIG. 13, Line G1 shows a machine current of the engine generator 10a, Line G2 shows a machine current of the engine generator 10b, and Line H shows a cross current.

Here, the parallel load current is indicated by "machine current of the engine generator 10a+machine current of the engine generator 10b−cross current×2". Also, in each of the engine generators 10a, 10b, the machine current is indicated by "load current borne by the engine generator+cross current". Therefore, in the graph shown in FIG. 13, "machine current indicated by Line G1−cross current indicated by Line H" is the load current borne by the engine generator 10a, whereas "machine current indicated by Line G2–cross current indicated by Line H" is the load current borne by the engine generator 10b.

As understood from FIG. 13, in the parallel operation, there is a cross current even if the parallel load current is 0 A (no load), and each of the engine generators 10a, 10b has a machine current which is not smaller than approximately 2 A, for example.

In FIG. 14, Line I shows the duty ratio change rate during normal operation, Lines I1 and I2 show an upper limit value and a lower limit value of the duty ratio change rate, respectively, during normal operation. Line J shows a duty ratio change rate when the diode (S-phase or T-phase) in the converter 28 is shorted. Lines J1 and J2 show an upper limit value and a lower limit value, respectively, of the duty ratio change rate when the diode (S-phase or T-phase) is shorted. Line K shows a duty ratio change rate when the diode (R-phase) in the converter 28 is shorted.

As understood from Lines I, J, and K, a difference between the duty ratio change rate during normal operation and the duty ratio change rate during a diode short incident is large in a range where the machine current (load current+ cross current) detected by the AC current detector 46 is small. In the range where the machine current (load current+ cross current) is small, the lower limit value of the duty ratio change rate during normal operation indicated by Line I2 is greater than the upper limit value of the duty ratio change rate indicated by Line J1 for the case where the diode (S-phase or T-phase) is shorted and the duty ratio change rate indicated by Line K for the case where the diode (R-phase) is shorted. Specifically, in the range where the machine current (load current+cross current) is not greater than 5 A, setting a threshold value of the duty ratio change rate to 81%, for example, makes it possible to discriminate between the duty ratio change rate during normal operation and the duty ratio change rate during a diode short incident even if the duty ratio change rate is subject to variability. In this example, 5 A represents the third threshold value, 81% represents the fourth threshold value, and if the machine current (load current+cross current) is not higher than 5 A and the duty ratio change rate is not higher than 81%, it is determined that there is an abnormality in the engine generator 10a (10b). As described above, it is possible to detect an abnormality in the engine generator 10a (10b) also in the parallel operation, by using the same third threshold value and fourth threshold value as used in the single-machine operation.

FIG. 15 shows abnormality detection ranges for each of the engine generators 10a and 10b when they are connected in parallel.

Referring to FIG. 15(a), when the converter 28 has its diode shorted (economical mode), the abnormality detection range based on duty ratio change rate is a range where the machine current (load current+cross current) is 2 A through 8 A, for example, whereas the abnormality detection range based on DC voltage decrease is a range where the machine current (load current+cross current) is, for example, 2 A through a maximum current.

Referring to FIG. 15(b), when the converter 28 has its diode shorted (ordinary mode), the abnormality detection range based on duty ratio change rate is a range where the machine current (load current+cross current) is 2 A through 8 A, for example whereas the abnormality detection range based on DC voltage decrease is a range where the machine current (load current+cross current) is, for example, 2.3 A through a maximum current. Therefore, when the machine current (load current+cross current) is not in the abnormality detection range due to a DC voltage decrease, and is not smaller than 2 A and smaller than 2.3 A, for example, it is possible to detect an abnormality of the engine generator 10a (10b) by using the abnormality detection based on duty ratio change rate.

Referring to FIG. 15(c), when the converter 28 has its thyristor shorted (economical mode), the abnormality detection range based on duty ratio change rate is a range where the machine current (load current+cross current) is 2 A through 8 A, for example, whereas the abnormality detection range based on DC voltage decrease is a range where the machine current (load current+cross current) is, for example, 2 A through a maximum current.

Referring to FIG. 15(d), when the converter 28 has its thyristor shorted (ordinary mode), an abnormality detection range based on DC over voltage is a range where the machine current (load current+cross current) is 2 A through 2.3 A, for example; an abnormality detection range based on duty ratio change rate is a range where the machine current (load current+cross current) is 2.3 A through 8 A, for example; and an abnormality detection range based on DC voltage decrease is a range where the machine current (load current+cross current) is, for example, 2.3 A through the maximum current.

Now, if the third threshold value of the duty ratio change rate is set to a conservative value of 5 A, for example, the abnormality detection range based on duty ratio change rate has an actual upper limit value of 5 A, for example. In this case, if the machine current (load current+cross current) is not greater than 5 A, it is possible to improve abnormality detection accuracy of the engine generator 10a (10b) by using the abnormality detection based on duty ratio change rate and the abnormality detection based on DC voltage decrease.

It should be noted here that the abnormality detection based on duty ratio is preferably not performed in the parallel operation since the machine current is always above the first threshold value (in the present preferred embodiment, 1.5 A) for the abnormality detection based on duty ratio under the influence of cross current.

During parallel operation, in a case where the thyristor is shorted (ordinary mode) under a low-load condition (when the machine current (load current+cross current) detected by the AC current detector 46 is small), the engine's number of revolutions is high and therefore the generated voltage (input voltage) is high, but the load is not capable of consuming a sufficient amount of electric power. As a result, electricity is charged in the smoothing capacitor 66 on the output side of the converter 28, causing an over voltage in the DC voltage detected by the DC voltage detector 44. It is reasonable, therefore, to think that an abnormality detection based on DC over voltage in the parallel operation takes place when the thyristor is shorted (ordinary mode) under a condition that the machine current (load current+cross current) is 2 A through 2.3 A, for example. In the economical mode where the engine's number of revolutions is low and there is a small amount of input energy, or in cases where there is a large load, the load consumes a sufficient amount of electric power, so the smoothing capacitor 66 is not charged to the threshold value when an abnormality is detected.

The engine generators 10a, 10b, which are connected in parallel as described above, preferably also use the procedures shown in FIG. 6 through FIG. 11, and each of the engine generators 10a, 10b provides the same advantages as achieved by the single-machine engine generator 10 except that the abnormality detection based on duty ratio preferably is not performed.

It should be noted here that it is not necessary that the converter controlling procedure in FIG. 8 for the single-machine engine generator 10 includes Steps S237, S239, S241, S243, or S245.

Also, Steps S213, S215, and S233 in FIG. 8 are not necessarily needed.

In the preferred embodiments described above, "duty ratio of the voltage detected by the input voltage detector 42" is expressed by (L time)/{(L time)+(H time)}, where "H" represents voltages detected as not higher than 0 and "L" represents voltages detected as higher than 0. However, "duty ratio of the voltage detected by the input voltage detector 42" may be expressed by (H time)/{(L time)+(H time)}, where "H" represents voltages detected as not higher than 0 and "L" represents voltages detected as higher than 0. In this case, the determination as to "whether or not the duty ratio is not higher than the second threshold value" in Step S227 in FIG. 8 is changed to a determination as to "whether or not the duty ratio is not lower than the second threshold value", and when the duty ratio is not lower than the second threshold value, it is determined that the duty ratio is in the abnormal range. Also, the determination as to "whether or not the duty ratio change rate is not higher than the fourth threshold value" in Step S239 is changed to a determination as to "whether or not the duty ratio change rate is not lower than the fourth threshold value", and when the duty ratio change rate is not lower than the fourth threshold value, it is determined that the duty ratio change rate is in the abnormal range.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An engine generator driven by an engine, the engine generator comprising:
   a generator body connected to the engine;
   a converter including a plurality of rectifiers that convert an output from the generator body to DC current;
   an inverter that converts an output from the converter to AC current;
   an input voltage detector that detects an input voltage from the generator body to the converter;
   an AC current detector that detects an AC current output from the inverter; and
   an abnormality detector that determines a presence or absence of an abnormality in the engine generator based on information regarding a duty ratio of the input voltage detected by the input voltage detector if the AC current detected by the AC current detector is not greater than a threshold value.

2. The engine generator according to claim 1, wherein the threshold value includes a first threshold value; and
   the abnormality detector determines that there is an abnormality in the engine generator if the AC current detected by the AC current detector is not higher than the first threshold value and if the duty ratio is in an abnormal range based on a comparison with a second threshold value.

3. The engine generator according to claim 2, wherein the abnormality detector determines that there is an abnormality in the engine generator if the state that the AC current detected by the AC current detector is not higher than the first threshold value and the duty ratio is in the abnormal range based on the comparison with the second threshold value continues for a first predetermined time.

4. The engine generator according to claim 1, wherein the threshold value includes a third threshold value; and
   the abnormality detector determines that there is an abnormality in the engine generator if the AC current detected by the AC current detector is not higher than the third threshold value and if a duty ratio change rate, which is a change rate of the duty ratio, is in an abnormal range based on a comparison with a fourth threshold value.

5. The engine generator according to claim 1, further comprising a DC voltage detector that detects a DC voltage output from the converter; wherein
   the abnormality detector determines that there is an abnormality in the engine generator if the DC voltage detected by the DC voltage detector is not higher than a fifth threshold value.

6. The engine generator according to claim 5, further comprising a revolutions detector that detects a number of revolutions of the engine; wherein
   the abnormality detector determines that there is an abnormality in the engine generator if the DC voltage detected by the DC voltage detector is not higher than the fifth threshold value and if the number of revolutions detected by the revolutions detector is not lower than a sixth threshold value.

7. The engine generator according to claim 6, wherein the abnormality detector determines that there is an abnormality in the engine generator if the state that the DC voltage detected by the DC voltage detector is not higher than the fifth threshold value and the number of revolutions detected by the revolutions detector is not lower than the sixth threshold value continues for a second predetermined time.

8. The engine generator according to claim 1, further comprising a DC voltage detector that detects a DC voltage output from the converter; wherein
   the abnormality detector determines that there is an abnormality in the engine generator if the DC voltage detected by the DC voltage detector is not lower than a seventh threshold value.

* * * * *